United States Patent
Mukesh et al.

(10) Patent No.: US 12,148,699 B2
(45) Date of Patent: Nov. 19, 2024

(54) HIGH ASPECT RATIO BURIED POWER RAIL METALLIZATION

(71) Applicant: International Business Machines Corporation, Armonk, NY (US)

(72) Inventors: Sagarika Mukesh, Albany, NY (US); Devika Sarkar Grant, Amsterdam, NY (US); Fee Li Lie, Albany, NY (US); Hosadurga Shobha, Niskayuna, NY (US); Thamarai selvi Devarajan, Niskayuna, NY (US); Aakrati Jain, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 17/806,570

(22) Filed: Jun. 13, 2022

(65) Prior Publication Data

US 2023/0402378 A1 Dec. 14, 2023

(51) Int. Cl.
*H01L 23/528* (2006.01)
*H01L 21/768* (2006.01)
*H01L 23/532* (2006.01)

(52) U.S. Cl.
CPC .... *H01L 23/5286* (2013.01); *H01L 21/76874* (2013.01); *H01L 23/5283* (2013.01); *H01L 23/53252* (2013.01); *H01L 23/53295* (2013.01)

(58) Field of Classification Search
CPC .......... H01L 23/5286; H01L 21/76874; H01L 23/5283
USPC ...................................................... 257/191
See application file for complete search history.

(56) References Cited

U.S. PATENT DOCUMENTS

| | | | |
|---|---|---|---|
| 5,380,560 | A | 1/1995 | Kaja et al. |
| 9,466,563 | B2 | 10/2016 | Mignot et al. |
| 9,570,395 | B1 | 2/2017 | Sengupta et al. |
| 10,573,593 | B2 | 2/2020 | Lin et al. |
| 10,679,941 | B2 | 6/2020 | Zhu et al. |
| 10,878,162 | B2 | 12/2020 | Peng et al. |
| 2020/0266169 | A1 | 8/2020 | Kang et al. |
| 2021/0280585 | A1 | 9/2021 | Jin |

(Continued)

OTHER PUBLICATIONS

Gupta et al., "Buried Power Rail Scaling and Metal Assessment for the 3 nm Node and Beyond," International Electron Devices Meeting (IEDM), 20.3, 2020, 4 pp.

(Continued)

*Primary Examiner* — Quoc D Hoang
(74) *Attorney, Agent, or Firm* — Kimberly Zillig

(57) ABSTRACT

A semiconductor component includes an area of dielectric material extending below an uppermost surface of a substrate. The semiconductor component further includes a trench formed so as to extend from above the uppermost surface of the substrate into the area of dielectric material. The semiconductor component further includes a non-metal liner coating interior surfaces of the trench. The semiconductor component further includes a metal liner coating interior surfaces of the non-metal liner. The semiconductor component further includes a power rail formed in the trench in direct contact with at least one of the metal liner or the non-metal liner such that the power rail extends into the area of dielectric material and above the uppermost surface of the substrate.

15 Claims, 23 Drawing Sheets

(56) References Cited

U.S. PATENT DOCUMENTS

2021/0376071 A1\* 12/2021 Liu ................. H01L 23/5286
2022/0352128 A1\* 11/2022 Lee ................. H01L 23/5286

OTHER PUBLICATIONS

Van der Veen et al., "Cobalt Bottom-Up Contact and Via Prefill enabling Advanced Logic and DRAM Technologies," International Interconnect Technology Conference and Materials for Advanced Metallization Conference (IITC/MAM), pp. 25-28, 2015.

\* cited by examiner

HIGH ASPECT RATIO BURIED POWER RAIL METALLIZATION

BACKGROUND

The present disclosure relates to the electrical, electronic, and computer fields. In particular, the present disclosure relates to the interconnects of semiconductor devices and methods of making the interconnects of semiconductor devices.

In integrated circuits, interconnects are structures that connect two or more circuit elements together electrically. In addition to providing the electrical connection to the front end devices (such as transistors), interconnects also go all the way back to the power delivery networks. Thus, interconnects, and their surrounding support components, may be considered back-end-of-line (BEOL) components. One common type of interconnect is a power rail.

In standard logic cells, power to the devices (e.g., transistors) is supplied to the source/drain contacts through power rails in BEOL metal layers. Power rails typically run across multiple adjacent cells. Accordingly, since power rails are typically used to supply power to a number of cells, the power rails are often implemented with much larger sizes (specifically, larger widths) compared to standard routing tracks/signal lines that are used within the cells. For example, a power rail can be up to three to four times larger than a normal routing line. Thus, power rails often take up significant amounts of area within cell design. The larger critical dimension of power rails is necessary to maintain an adequate resistance through the power rail to maintain adequate power distribution targets, including IR drop and frequency, within the device.

SUMMARY

Embodiments of the present disclosure include a semiconductor component. The semiconductor component includes an area of dielectric material extending below an uppermost surface of a substrate. The semiconductor component further includes a trench formed so as to extend from above the uppermost surface of the substrate into the area of dielectric material. The semiconductor component further includes a non-metal liner coating interior surfaces of the trench. The semiconductor component further includes a metal liner coating interior surfaces of the non-metal liner. The semiconductor component further includes a power rail formed in the trench in direct contact with at least one of the metal liner or the non-metal liner such that the power rail extends into the area of dielectric material and above the uppermost surface of the substrate.

Additional embodiments of the present disclosure include a semiconductor component. The semiconductor component includes an area of dielectric material extending below an uppermost surface of a substrate. The semiconductor component further includes a trench formed so as to extend from above the uppermost surface of the substrate into the area of dielectric material. The semiconductor component further includes a non-metal liner coating interior surfaces of the trench. The semiconductor component further includes a metal liner coating the non-metal liner such that the non-metal liner separates the metal liner from the interior surfaces of the trench, wherein the metal liner extends along a height that is less than a height of the non-metal liner. The semiconductor component further includes a power rail formed in the trench in direct contact with the non-metal liner such that the power rail extends into the area of dielectric material and above the uppermost surface of the substrate.

Additional embodiments of the present disclosure include a method of making a semiconductor component. The method includes forming a deep trench isolation area in a substrate. The method further includes forming a trench extending into the deep trench isolation area. The method further includes lining interior surfaces of the trench with a non-metal liner. The method further includes forming, by electroless plating, a metal buried power rail in the trench in direct contact with the non-metal liner.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

DETAILED DESCRIPTION

Figure 1:
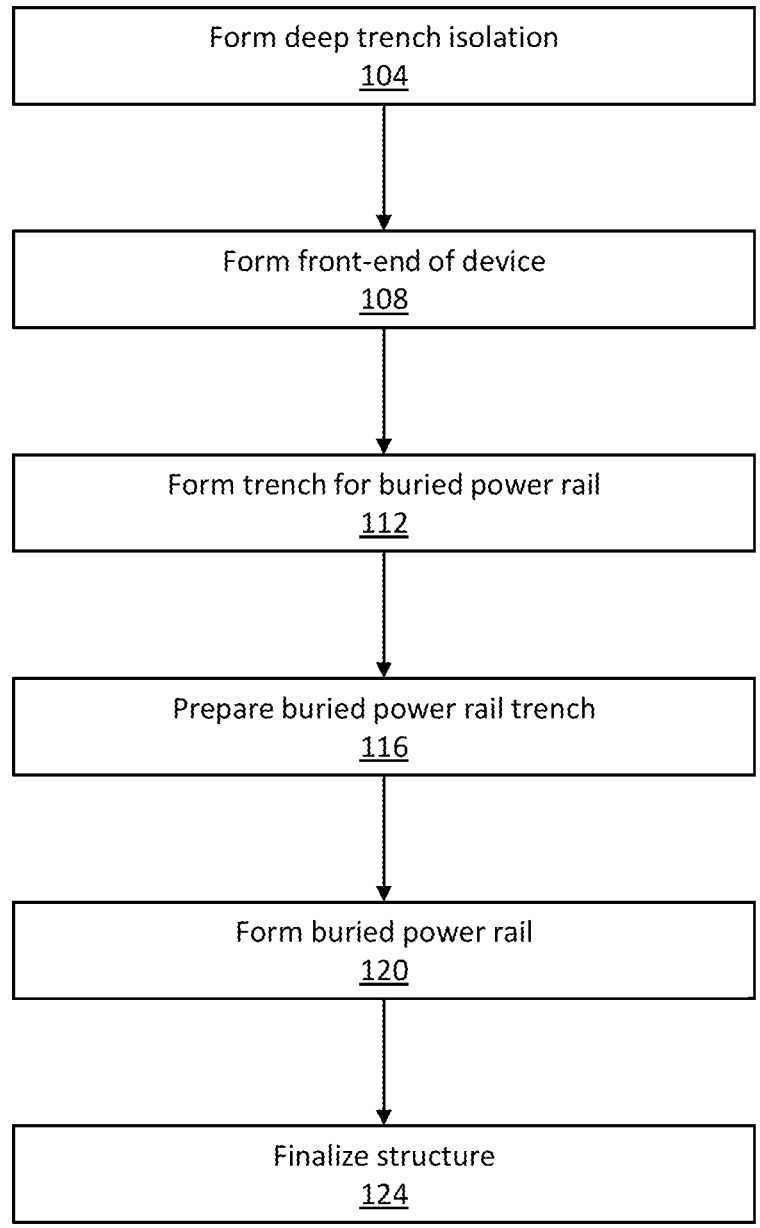
FIG. 1 illustrates a flowchart of an example method for forming a semiconductor component, in accordance with embodiments of the present disclosure.

Aspects of the present disclosure relate generally to the electrical, electronic, and computer fields. In particular, the present disclosure relates to semiconductor devices. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

Turning now to an overview of technologies that are more specifically relevant to aspects of the present disclosure, in integrated circuits, power to the devices (e.g., transistors) can be supplied to the source/drain contacts through power rails in BEOL metal layers. Since the power rails are typically used to supply power to a number of cells, the power rails are often implemented with much larger sizes (specifically, larger widths) compared to standard routing tracks/signal lines that are used within the cells. For example, a power rail can be up to three to four times larger than a normal routing line. Thus, power rails often take up significant amounts of area within cell design. The larger critical dimension of power rails is necessary to maintain an adequate resistance through the power rail to maintain adequate power distribution targets, including IR drop and frequency, within the device.

One approach to reduce the lateral (width) size of the power rails is to make them deeper to allow a smaller top-down cross-section (e.g., smaller width metal lines) while effectively keeping the total metal volume in the power rail either the same or increased. The deepening and narrowing of the power rails can be referred to as increasing the aspect ratio of the power rails, where the "aspect ratio" refers to the ratio of the depth to the width of the geometry. Accordingly, power rails that are deeper and narrower can be referred to as having a "higher aspect ratio" than power rails that are shallower and wider.

The increase in aspect ratio provides lower resistance across the power rail, which enables the maintenance of improved IR drop and frequency. However, simply increasing the aspect ratio of the power rail in the BEOL introduces challenges. For example, increasing the aspect ratio of power rails may necessitate larger aspect ratio vias to connect signal lines to the device. Increasing the aspect ratio of vias results in a smaller bottom critical dimension of the via, leading to higher contact resistance. Additionally, increasing the aspect ratio of power rails may require the signal lines to also have similar aspect ratios. Increasing the aspect ratio of signal lines can cause increased capacitance between tracks in the BEOL.

One approach to address these challenges introduced by increasing the aspect ratios of power rails includes "burying" or positioning the power rails underneath a physical device (e.g., transistor). This approach enables the aspect ratio of the power rail to be increased independently of the signal lines in the BEOL. Accordingly, this approach enables significantly lower resistance through the power rail without driving any negative impact to either via resistance or capacitance in the BEOL. In buried power rails, power can be supplied to the metal contacts through a bottom-up approach rather than the conventional top-down approach.

Buried power rails are considered to be a hyper-scaling element, essential for future technology node scaling. For example, burying the power rail under the physical device allows for the cell height of the standard cell to be defined solely by the number of routing tracks or signal lines as opposed to a combination of power rails and routing tracks. This provides the ability to scale easily down from a 6.0 to 6.5 routing tracks (6.5 T) cell height (assuming either a power rail width equal to either 2 or 3 times that of a routing track line) to a 5.0 routing track cell height, even if the number of actual routing tracks are the same.

Currently, cobalt is the preferred material for buried power rails given its low resistivity, suitability for chemical-mechanical planarization (CMP) and/or wet etch processes, and its widespread use and availability for middle-of-line (MOL) processes relative to alternative appropriate and available materials (such as ruthenium or tungsten).

However, using cobalt in a buried power rail structure is not without challenges. In particular, using cobalt to fill a high aspect ratio buried power rail is prone to the formation of voids during metallization, which may result in overall higher resistance of the via. Additionally, wet recessing of cobalt is extremely difficult to control due to erosion and grain orientation of the material.

Embodiments of the present disclosure may overcome these and other drawbacks of existing solutions by utilizing electroless plating to form cobalt for a buried power rail. As discussed in further detail below, in some embodiments of the present disclosure, a seed layer of palladium may be used for the growth of cobalt thereon to form a high aspect ratio buried power rail structure. In some embodiments of the present disclosure, a metal liner may be used to grow cobalt thereon to form a high aspect ratio buried power rail structure. In accordance with some embodiments of the present disclosure, a backside power delivery network (BSPDN) can be utilized where the seed layer of palladium is intact. In accordance with some embodiments of the present disclosure, a BSPDN can be utilized where the palladium seed layer has been etched away.

In general, the various processes used to form lines and vias for a semiconductor chip or micro-chip that will be packaged into an IC fall into three general categories, namely, deposition, removal/etching, and patterning/lithography.

Deposition is any process that grows, coats, or otherwise transfers a material onto the substrate. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the substrate surface that would otherwise require higher temperatures associated with conventional CVD. Energetic ion bombardment during PECVD deposition can also improve the film's electrical and mechanical properties.

Removal/etching is any process that removes material from the substrate. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on substrates. With RIE the plasma is generated under low pressure (vacuum) by an electromagnetic field. High-energy ions from the RIE plasma attack the substrate surface and react with it to remove material.

Patterning/lithography is the formation of three-dimensional relief images or patterns on the semiconductor substrate for subsequent transfer of the pattern to a layer arranged beneath the pattern. In semiconductor lithography, the patterns are formed by a light sensitive polymer called a photoresist.

To build the complex structures that make up a transistor and the many wires that connect the millions of transistors of a circuit, lithography and etch pattern transfer steps are repeated multiple times. Each pattern being printed on the substrate is aligned to previously formed patterns, and gradually the conductive and insulative regions are built up to form the final device.

These processes can be used in different combinations and orders within the context of two main integration schemes for forming lines and vias. A subtractive scheme refers to processes of forming line and via structures by depositing metal, and then etching the metal to form lines and vias. Alternatively, a damascene scheme refers to the processes of forming line and via structures by depositing an oxide layer, forming a trench into the oxide layer, and then depositing metal into the trench. In particular, in a typical dual damascene process (also referred to as a dual damascene flow), a structure undergoes a diffusion barrier etch step, then a via dielectric is deposited. A subsequent etch step then forms a gap in which metal is deposited to form the lines and vias simultaneously. Subtractive and damascene schemes can both be used in the formation of complex interconnect structures. Embodiments of the semiconductor component set forth in this disclosure are formed using damascene schemes.

FIG. 1 depicts a flowchart of an example method 100 for forming a semiconductor component, according to embodiments of the present disclosure. The method 100 begins with operation 104, wherein a deep trench isolation (DTI) is formed. In accordance with at least one embodiment of the present disclosure, the performance of operation 104 further includes the performance of a number of sub-operations.

More specifically, the performance of operation 104 includes performing an initial fin patterning and shallow trench isolation (STI) silicon etch. The initial formation of the layers that make up the substrate and nanosheet layers of the fins prior to the performance of operation 104 is not within the scope of this disclosure and can be achieved in any suitable manner. In the performance of operation 104, the existing layers are patterned and etched. In particular, the substrate is patterned and etched to form a shallow trench for the STI, and nanosheet layers are patterned and etched to form fins.

Figure 2A:
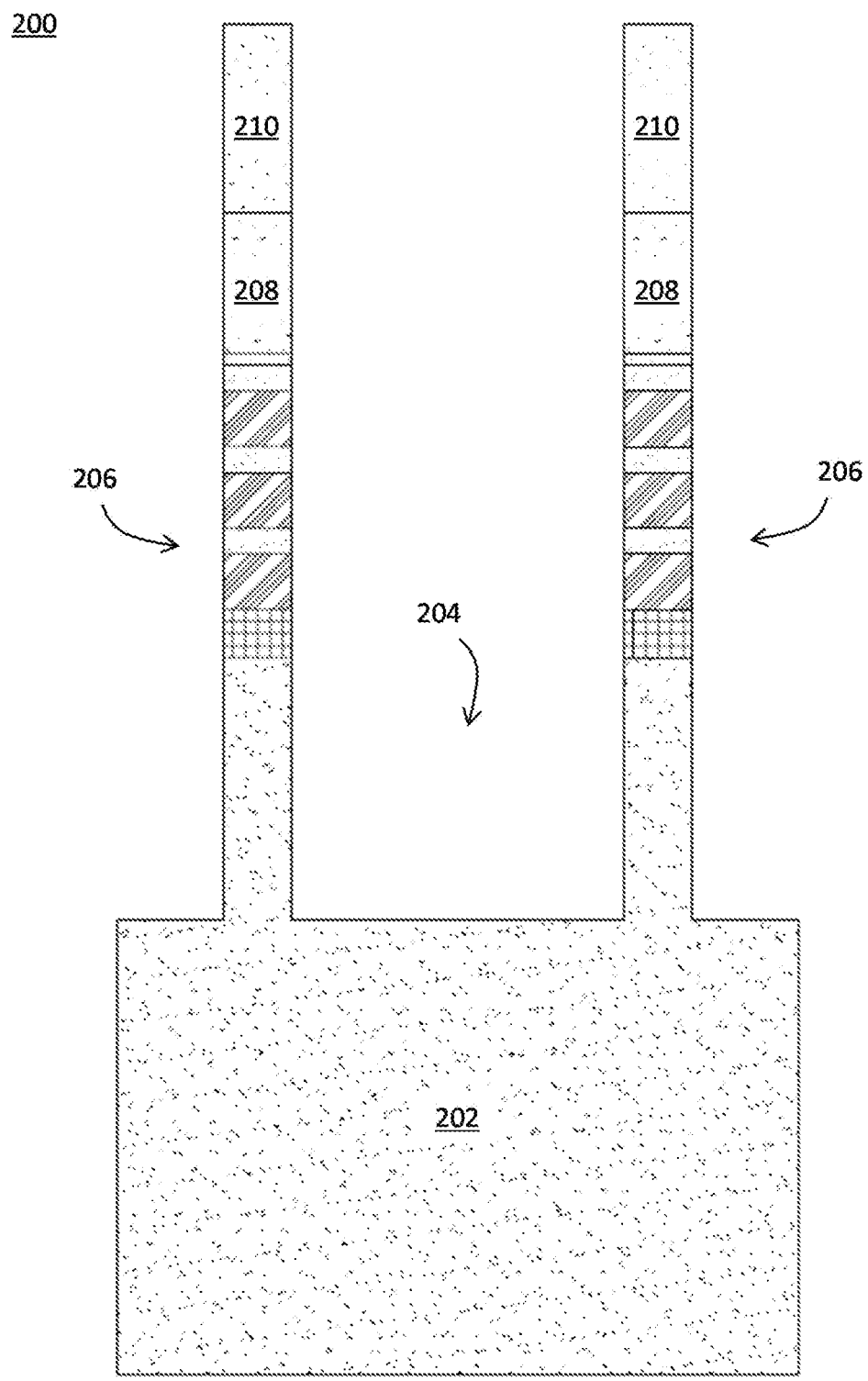
FIG. 2A illustrates an example of a component following the performance of a portion of the example method of FIG. 1, in accordance with embodiments of the present disclosure.

FIG. 2A depicts an example structure 200 following the performance of the above portions of operation 104. In particular, FIG. 2A depicts the structure 200 including a substrate 202, and a shallow trench 204 formed in the substrate 202 by selectively patterning and etching the substrate 202. More specifically, portions of the substrate 202 were selectively removed such that the remaining portions of the substrate 202 form the shallow trench 204. The structure 200 further includes fins 206 made up of nanosheet layers that were selectively patterned and etched to the same extent as the underlying substrate 202. The structure 200 further includes a nitride layer 208 and an oxide layer 210 that were selectively patterned and etched to the same extent as the underlying fins 206.

In accordance with at least one embodiment of the present disclosure, the performance of operation 104 further includes performing a deep trench isolation (DTI) patterning and etch. In particular, a mask is selectively applied so as to cover the fins and the remaining portions of the substrate that formed the shallow trench and so as to expose a portion of the uppermost surface of the substrate within the shallow trench that will be further etched to form a deep trench for the DTI. The substrate is then etched where it is not covered by the mask.

Figure 2B:
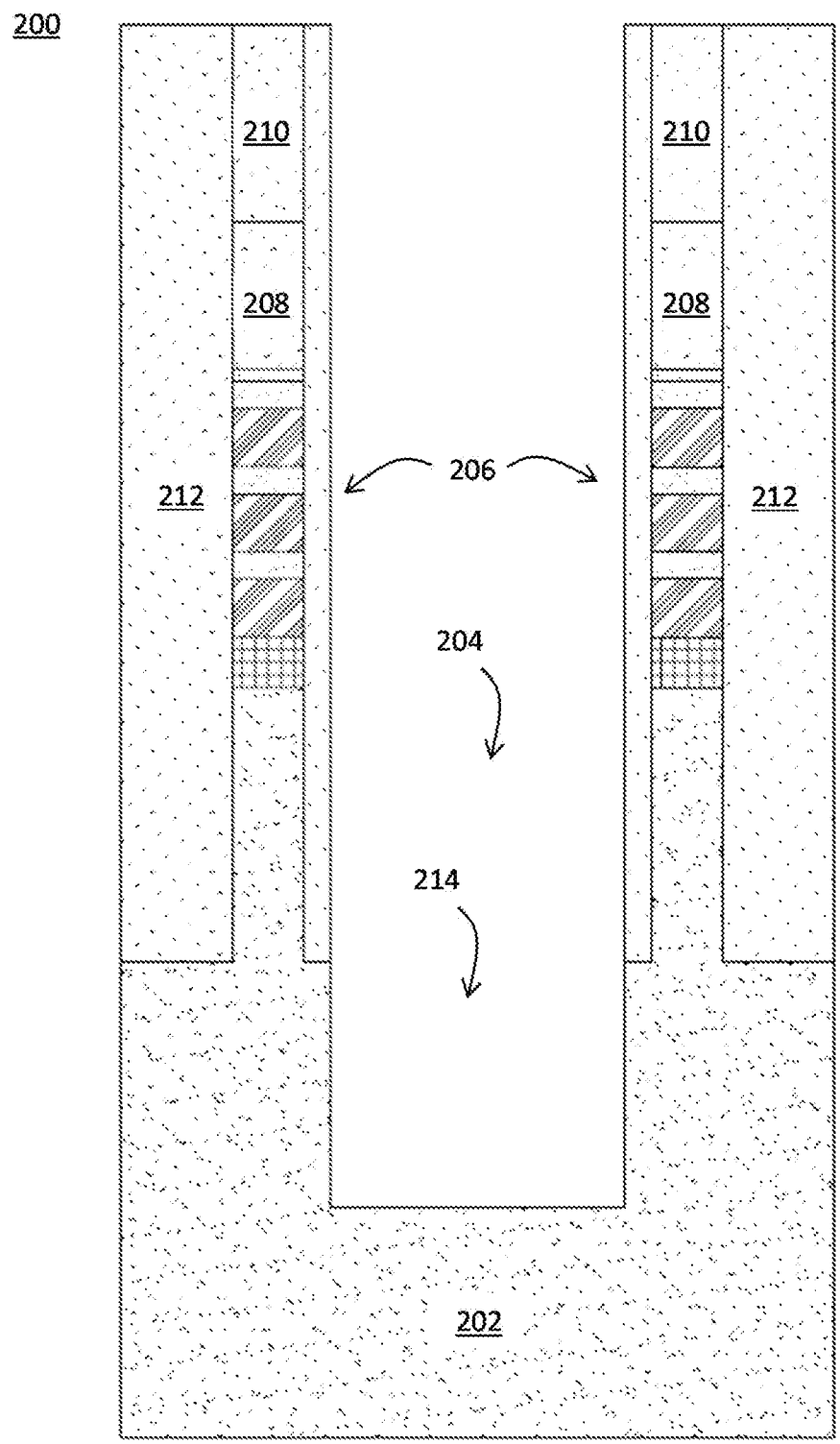
FIG. 2B illustrates an example of a component following the performance of a portion of the example method of FIG. 1, in accordance with embodiments of the present disclosure.

FIG. 2B depicts the example structure 200 following the performance of this portion of operation 104. As shown in FIG. 2B, a mask 212 has been applied, and the substrate 202 has been etched where it was not covered by the mask 212 such that a deep trench 214 is formed in the uppermost surface of the substrate 202 within the shallow trench 204. In accordance with at least one embodiment of the present disclosure, because the mask 212 is applied so as to cover both sides of the fins 206, the deep trench 214 is formed having a slightly narrower width than the shallow trench 204.

In accordance with at least one embodiment of the present disclosure, the performance of operation 104 further includes performing an optical stack strip. In particular, the mask is removed from the structure.

Figure 2C:
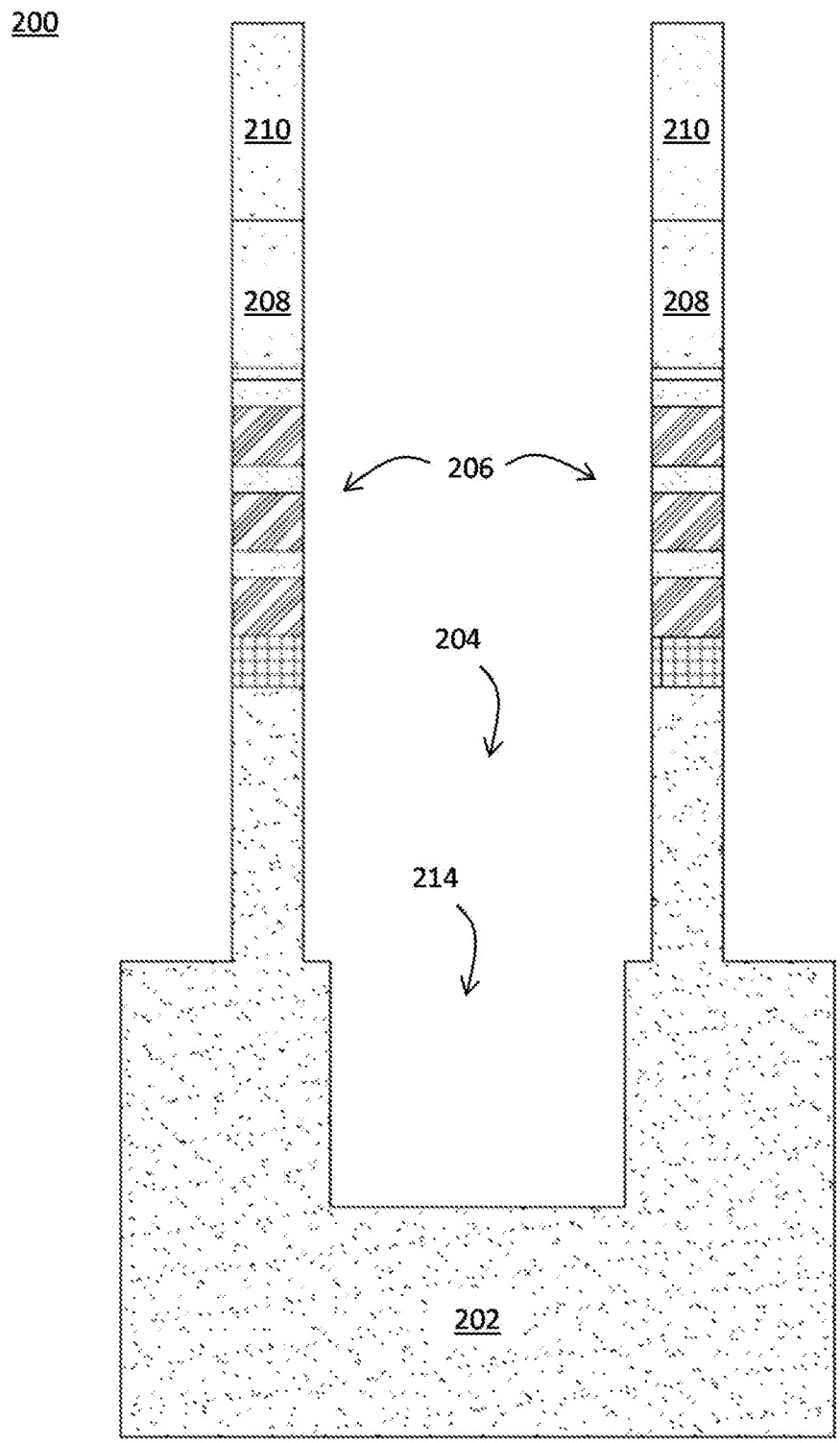
FIG. 2C illustrates an example of a component following the performance of a portion of the example method of FIG. 1, in accordance with embodiments of the present disclosure.

FIG. 2C depicts the example structure 200 following the performance of this portion of operation 104. As shown in FIG. 2C, the mask 212 (shown in FIG. 2B) has been removed from the structure 200.

In accordance with at least one embodiment of the present disclosure, the performance of operation 104 further includes performing a flowable chemical vapor deposition (FCVD) oxide fill to form the STI and DTI. More specifically, the shallow trench and the deep trench are filled with an oxide to form the STI and the DTI. In alternative embodiments, another suitable method may be used to fill the shallow trench and deep trench with oxide. The performance of operation 104 further includes removing the nitride layer and the oxide layer from on top of the nanosheet fins.

Figure 2D:
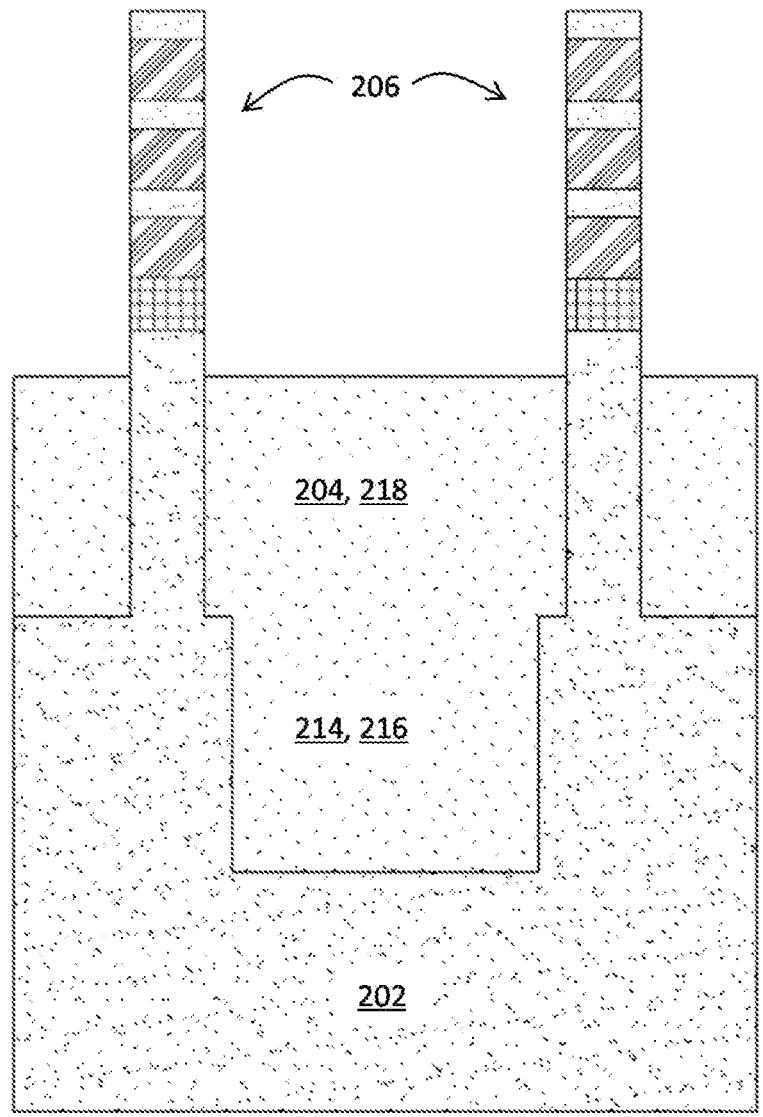
FIG. 2D illustrates an example of a component following the performance of a portion of the example method of FIG. 1, in accordance with embodiments of the present disclosure.

FIG. 2D depicts the example structure 200 following the performance of operation 104. As shown in FIG. 2D, the shallow trench 204 and the deep trench 214 have been filled with an oxide material so as to form a DTI 216 and an STI 218. Additionally, the nitride layer 208 and oxide layer 210 (shown in FIG. 2C) have been removed from the structure 200.

Returning to FIG. 1, the method 100 proceeds from operation 104 to operation 108, wherein a front-end of device formation is followed by a replacement metal gate process. In accordance with at least one embodiment of the present disclosure, the performance of operation 108 further includes the performance of a number of sub-operations. The details of the front-end of device formation and replacement metal gate process are not within the scope of this disclosure and can be achieved in any suitable manner.

Figure 2E:
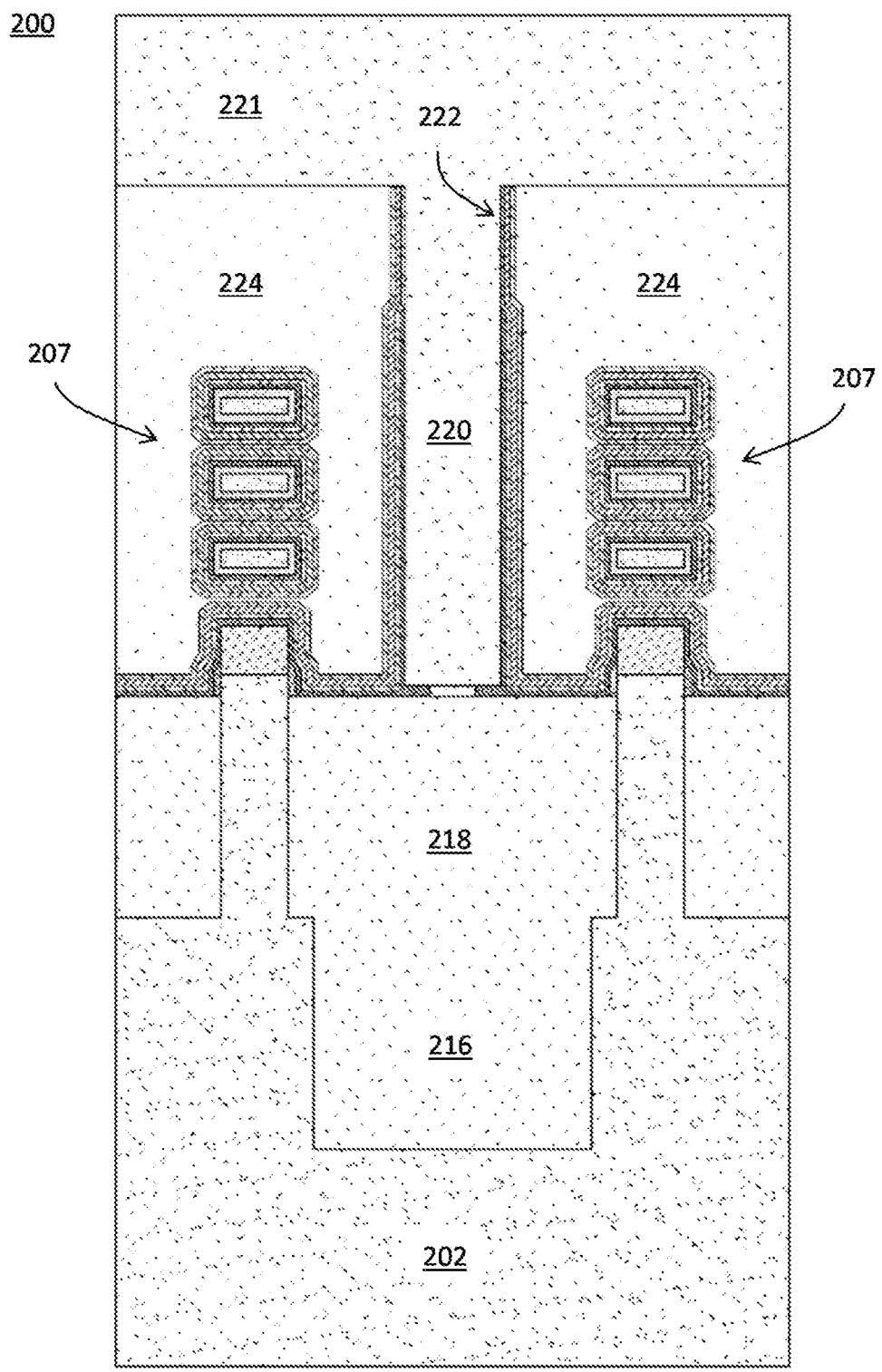
FIG. 2E illustrates an example of a component following the performance of a portion of the example method of FIG. 1, in accordance with embodiments of the present disclosure.

FIG. 2E depicts the example structure 200 following the performance of operation 108. As shown in FIG. 2E, the performance of operation 108 has resulted in the formation of a column 220 of nitride material 221 arranged above the DTI 216 and STI 218. The column 220 is arranged within a lined channel 222 formed between adjacent areas of tungsten 224 included in front end of line devices. Each of the adjacent areas of tungsten 224 surrounds a respective p-work function metal stack 207, which has been formed in place of each of the nanosheet fins 206 (shown in FIG. 2D).

Returning to FIG. 1, the method 100 proceeds from operation 108 to operation 112, wherein a trench for the buried power rail is formed. In accordance with at least one embodiment of the present disclosure, the performance of operation 112 includes the performance of a number of sub-operations.

In accordance with at least one embodiment of the present disclosure, the performance of operation 112 includes depositing an oxide layer on top of the nitride material of the structure. The performance of operation 112 further includes patterning and etching the structure to selectively remove a portion of the oxide layer, the underlying nitride material, and the underlying oxide of both the STI and the DTI to form a trench having a high aspect ratio. In particular, the structure is patterned such that all of the nitride material within the lined channel is removed by etching. Accordingly, the trench extends from the uppermost surface of the oxide layer all the way into the oxide of the DTI at a width that is equal to that of the lined channel. In accordance with embodiments of the present disclosure, the patterning stack is removed prior to the deposition of the liner.

The performance of operation 112 further includes depositing a silicon carbon nitride (SiCN) liner over the structure so as to cover the surfaces of the structure that were exposed by the etching. Accordingly, the SiCN liner is in direct contact with the oxide that forms the STI and DTI. The SiCN liner is also in direct contact with the sides of the lined channel which was previously filled with the nitride material. Notably, the SiCN liner is made of a silicon nitride material. Silicon nitrides are a group of advanced engineering ceramics with high strength, fracture toughness, hardness, wear resistance and good chemical and thermal stability. In other words, the SiCN liner is not made of a metal material.

Figure 2F:
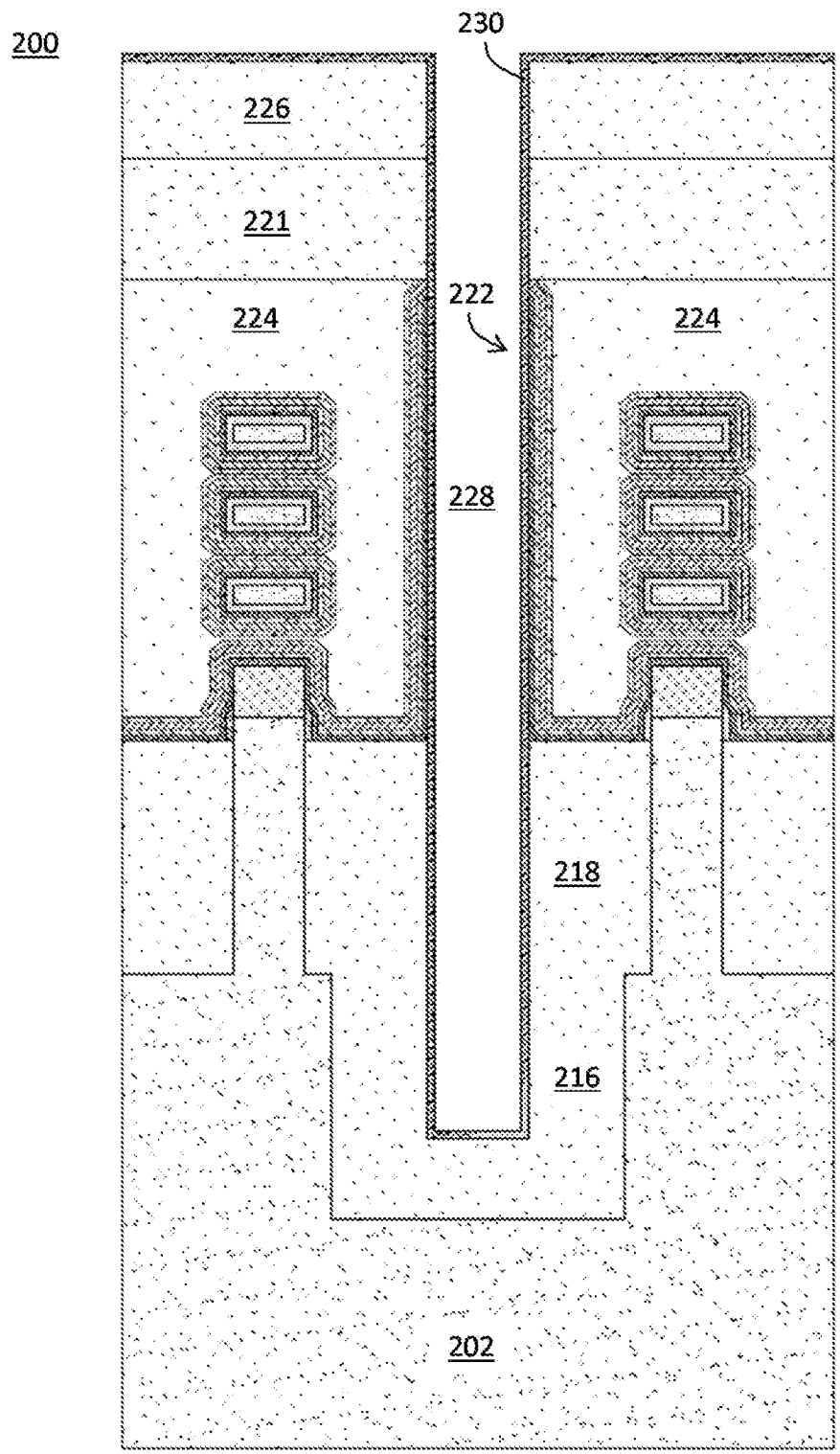
FIG. 2F illustrates an example of a component following the performance of a portion of the example method of FIG. 1, in accordance with embodiments of the present disclosure.

FIG. 2F depicts the example structure 200 following the performance of the above portions of operation 112. As shown, an oxide layer 226 has been deposited on top of the nitride material 221, and the oxide layer 226 and nitride material 221 were subsequently patterned and etched, along with the underlying oxide material of the STI 218 and DTI 216, to form a high aspect ratio trench 228 extending from the uppermost surface of the oxide layer 226, through the oxide layer 226, through the nitride material 221, through the oxide of the STI 218, and into the oxide of the DTI 216. As shown, all of the nitride material 221 has been removed from within the lined channel 222. As further shown in FIG. 2F, the structure 200 has been subsequently coated with an SiCN liner 230 such that all surfaces of the structure 200 that were exposed following the etching are coated with a thin layer of SiCN. As shown, the SiCN liner 230 is in direct contact with the oxide of the STI 218 and DTI 216 and covers the interior surfaces of the lined channel 222.

In accordance with at least one embodiment of the present disclosure, the performance of operation 112 further includes performing a titanium nitride (TiN) deposition. In particular, the TiN deposition is preferably an isotropic TiN deposition in which TiN is isotropically deposited on the structure such that both vertical and horizontal exposed surfaces are covered with a thin layer of the TiN. Notably, the TiN layer is a crystalline inorganic compound and is a hard, dense, refractory material with very high electrical conductivity. The TiN layer is made of a metal material.

Figure 2G:
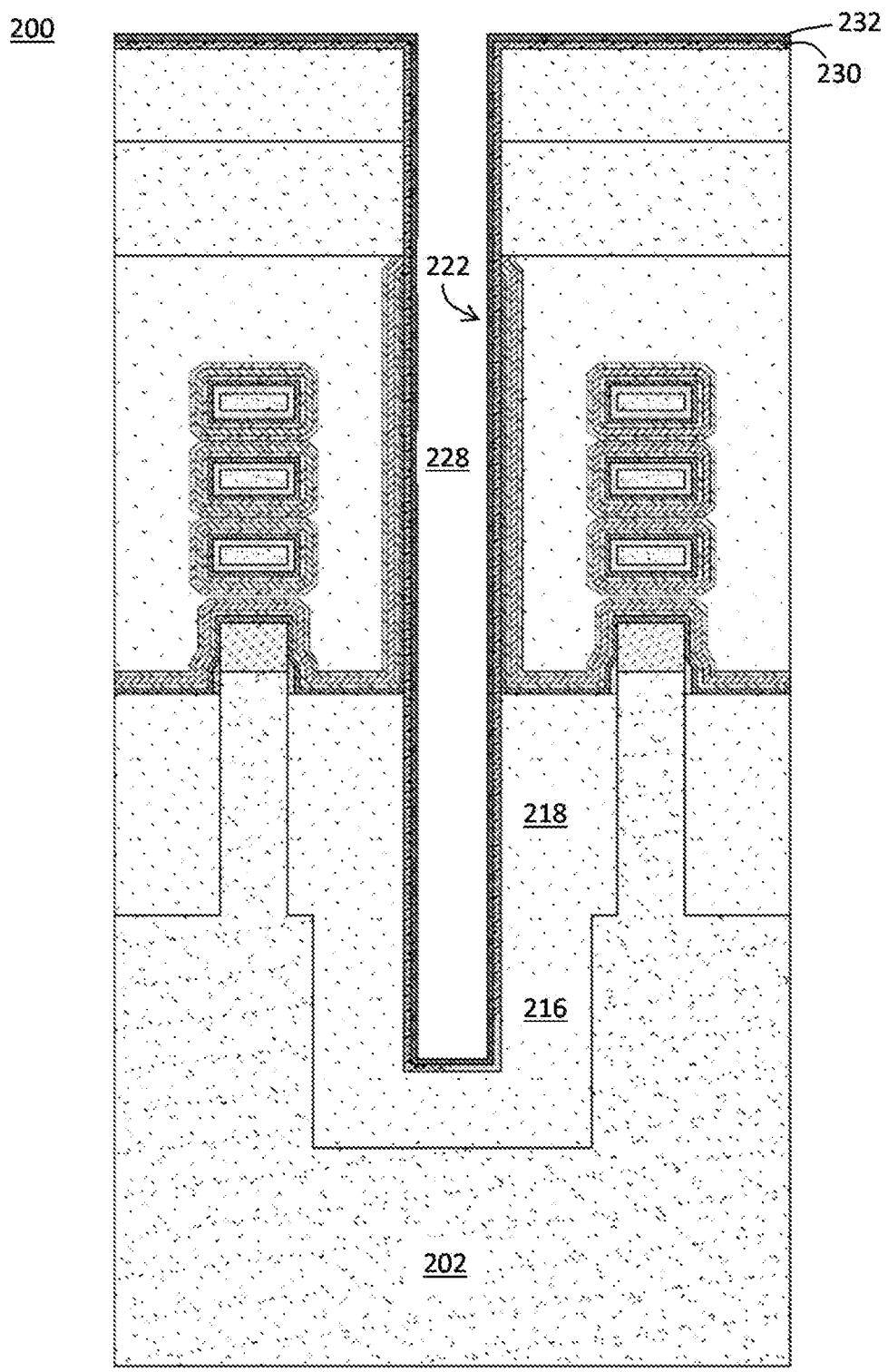
FIG. 2G illustrates an example of a component following the performance of a portion of the example method of FIG. 1, in accordance with embodiments of the present disclosure.

FIG. 2G depicts the example structure 200 following the performance of this portion of operation 112. As shown, a thin TiN layer 232 has been isotropically deposited over the entirety of the structure 200. Accordingly, the TiN layer 232 entirely covers the SiCN liner 230 that was previously formed on the structure 200. As a result, the SiCN liner 230 is arranged between the TiN layer 232 and the oxide of the STI 218 and DTI 216 and between the TiN layer 232 and the lined channel 222. In other words, the SiCN liner 230 separates the TiN layer 232 from the oxide of the STI 218 and DTI 216 and lined channel 222. Additionally, the interior surface of the trench 228 is now covered by the TiN layer 232 such that the TiN layer 232 forms the exposed interior surface of the trench 228.

Following the performance of this portion of operation 112, the trench for the buried power rail has been formed. In other words, the performance of operation 112 has been completed. Accordingly, FIG. 2G depicts the structure 200 following the performance of operation 112.

Returning to FIG. 1, the method 100 proceeds from operation 112 to operation 116, wherein the buried power rail trench is prepared for the subsequent formation of the buried power rail at operation 120. In accordance with at least one embodiment of the present disclosure, the performance of operations 116 and 120 further includes the performance of a number of sub-operations.

Additionally, the performance of operations 116 and 120 can be achieved by performing more than one distinct group of sub-operations, two of which are discussed in further detail herein. In particular, a first illustrative embodiment of the present disclosure includes performing a first group of sub-operations to prepare the buried power rail trench at operation 116 and a first group of sub-operations to form the buried power rail at operation 120. The first embodiment is discussed below with reference to FIGS. 2H-2M. A second illustrative embodiment of the present disclosure includes performing a second group of sub-operations to prepare the buried power rail trench at operation 116 and a second group of sub-operations to form the buried power rail at operation 120. The second embodiment is discussed below with reference to FIGS. 3A-3D.

In accordance with the first illustrative embodiment, the performance of operation 116 includes performing an organic planarization layer (OPL) fill for a chamfer. In particular, OPL is applied to the structure so as to fill the buried power rail trench. To ensure that the entirety of the buried power rail trench is completely filled, a superfluous amount of the OPL is applied, thereby forming an OPL layer on top of the structure as well.

Figure 2H:
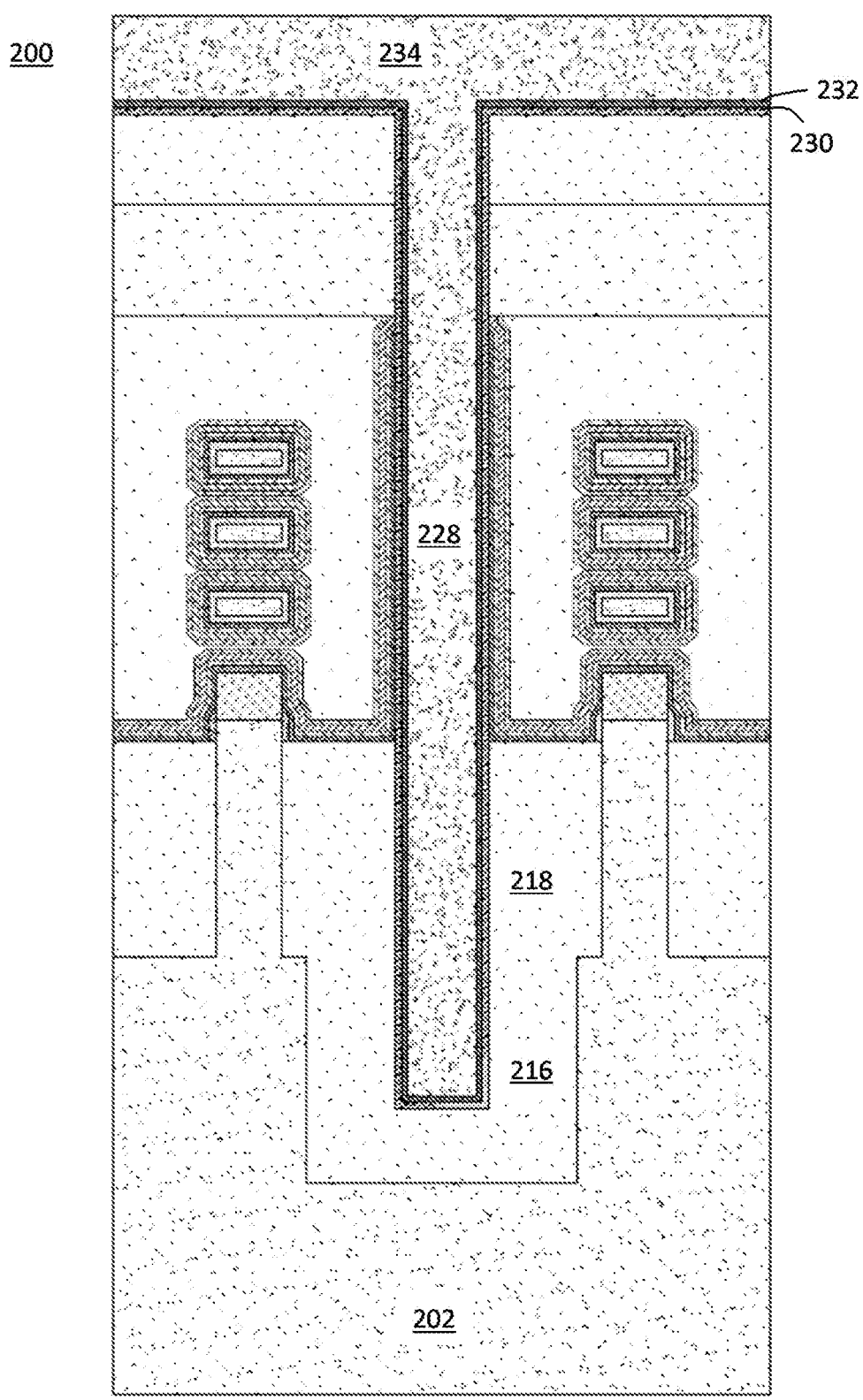
FIG. 2H illustrates an example of a component following the performance of a portion of the example method of FIG. 1, in accordance with embodiments of the present disclosure.

FIG. 2H depicts the example structure 200 following the performance of this portion of operation 116. As shown, OPL 234 has been formed so as to fill the entirety of the trench 228 (also referred to herein as the "buried power rail trench") and forms a layer of overfill on top of the structure 200. As shown, the TiN layer 232 is now arranged between the SiCN liner 230 and the OPL 234.

In accordance with the first illustrative embodiment, the performance of operation 116 further includes performing an OPL recess for the chamfer. In particular, OPL is removed from the entirety of the structure except for a relatively small layer left in the bottom of the buried power rail trench. Accordingly, the OPL has been removed from the top of the structure as well as from the majority of the buried power rail trench. The remaining portion of OPL in the bottom of the buried power rail trench is in direct contact with the TiN layer that remains covering the interior surfaces of the buried power rail trench.

Figure 2I:
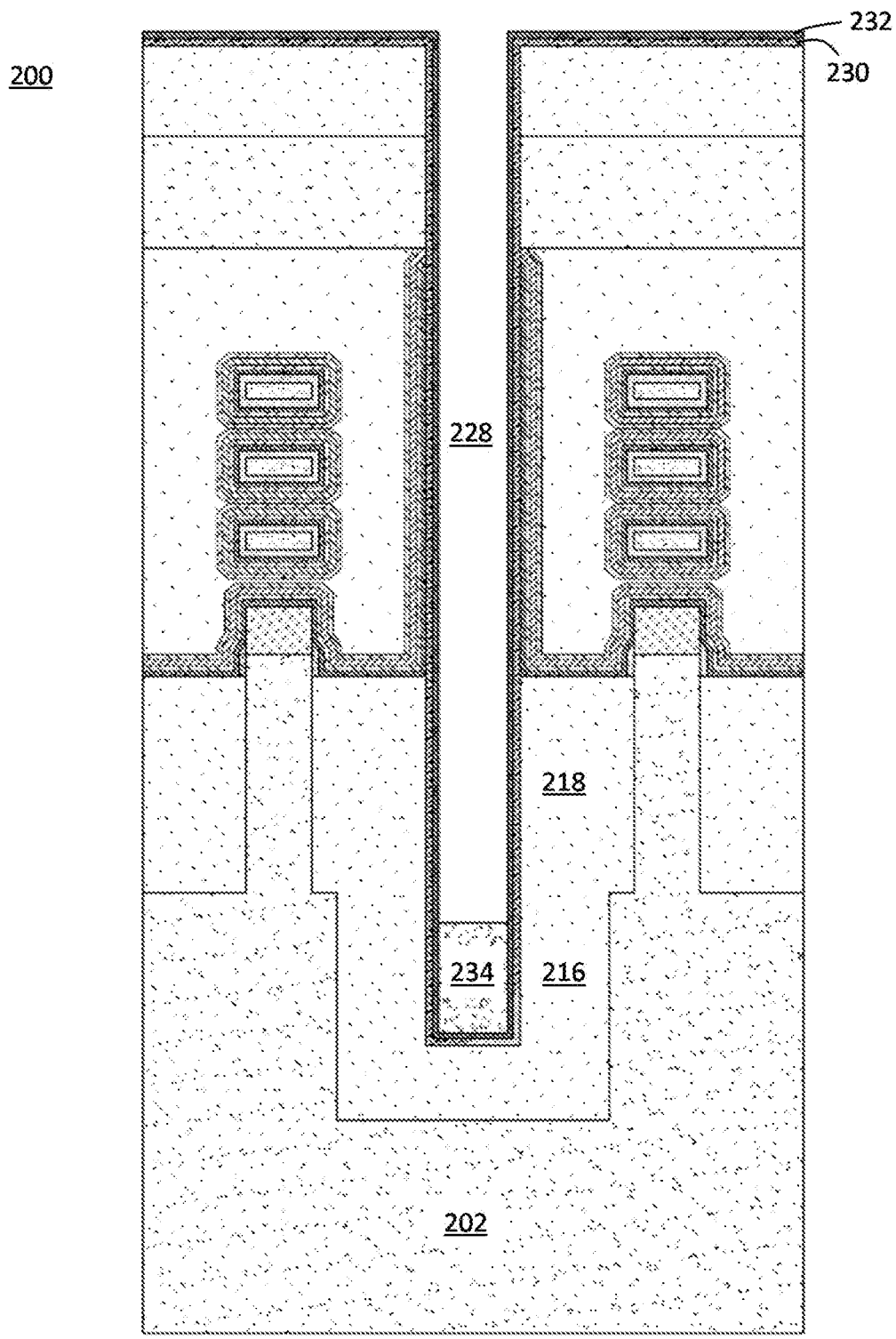
FIG. 2I illustrates an example of a component following the performance of a portion of the example method of FIG. 1, in accordance with embodiments of the present disclosure.

FIG. 2I depicts the example structure 200 following the performance of this portion of operation 116. As shown, the OPL 234 has been recessed within the buried power rail trench 228 such that only a relatively small amount of the OPL 234 remains filling the bottom of the buried power rail trench 228. In accordance with some embodiments of the present disclosure, the amount of OPL 234 that remains following the recess is small enough such that the uppermost surface of the recessed OPL 234 is arranged lower than the top of the DTI 216. In other words, the entirety of the remaining recessed OPL 234 is arranged within the DTI 216 and none is arranged within the STI 218. In alternative embodiments, other amounts of OPL 234 may be left remaining following the recess, so long as the amount enables subsequently etching the TiN layer 232 to the desired depth, as discussed in further detail below.

In accordance with the first illustrative embodiment, the performance of operation 116 further includes performing an isotropic TiN wet etch to recess the height of the TiN layer within the buried power rail trench. Except for the remaining recessed portion of the TiN layer within the buried power rail trench, the isotropic TiN wet etch removes the TiN layer from the remainder of the interior surfaces of the buried power rail trench, exposing the SiCN liner that remains covering the interior surfaces of the buried power rail trench.

Figure 2J:
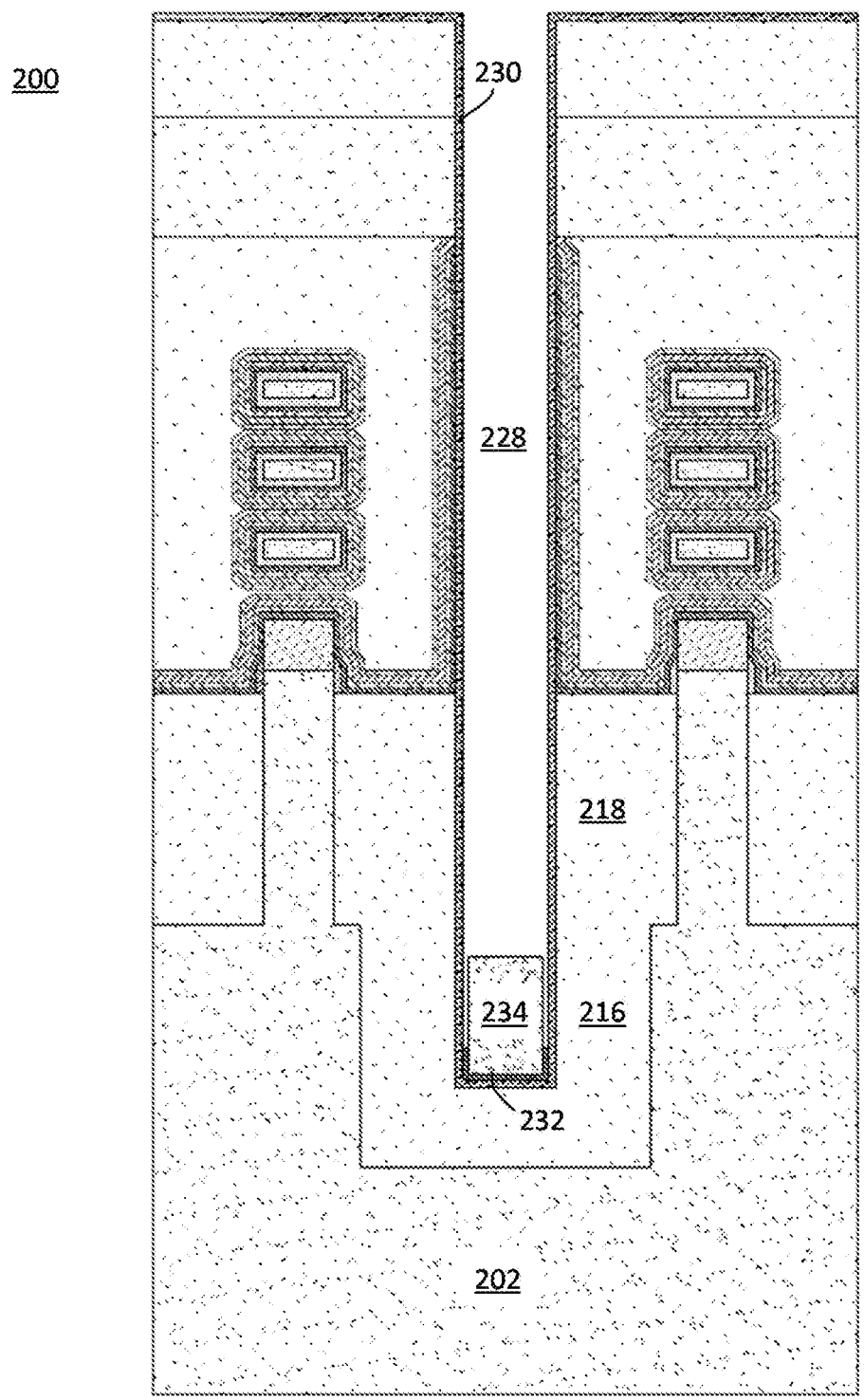
FIG. 2J illustrates an example of a component following the performance of a portion of the example method of FIG. 1, in accordance with embodiments of the present disclosure.

FIG. 2J depicts the structure 200 following the performance of this portion of operation 116. As shown, the TiN layer 232 has been isotropically etched such that it has been removed entirely from all surfaces on which it was exposed by the previous recess of the OPL 234. Furthermore, the isotropic TiN wet etch process enables the removal of a portion of the TiN layer 232 that is arranged between the remaining recessed OPL 234 and the SiCN liner 230. In other words, following the etch process, a portion of the TiN layer 232 arranged between the OPL 234 and the SiCN liner 230 remains. The amount of TiN layer 232 that is left following the etch process is controllable by the specifications of the etch process, such as the duration. The amount of TiN layer 232 that is left following the etch process is an amount sufficient to contain the palladium on which the cobalt for the buried power rail will subsequently be grown, as discussed in further detail below.

In accordance with the first illustrative embodiment, the performance of operation 116 further includes performing an OPL ash to remove the remaining OPL from the bottom of the buried power rail trench after the isotropic TiN wet etch process has been performed. Once the remaining OPL is removed, a small cavity is formed by the remaining TiN layer at the bottom of the buried power rail trench.

Figure 2K:
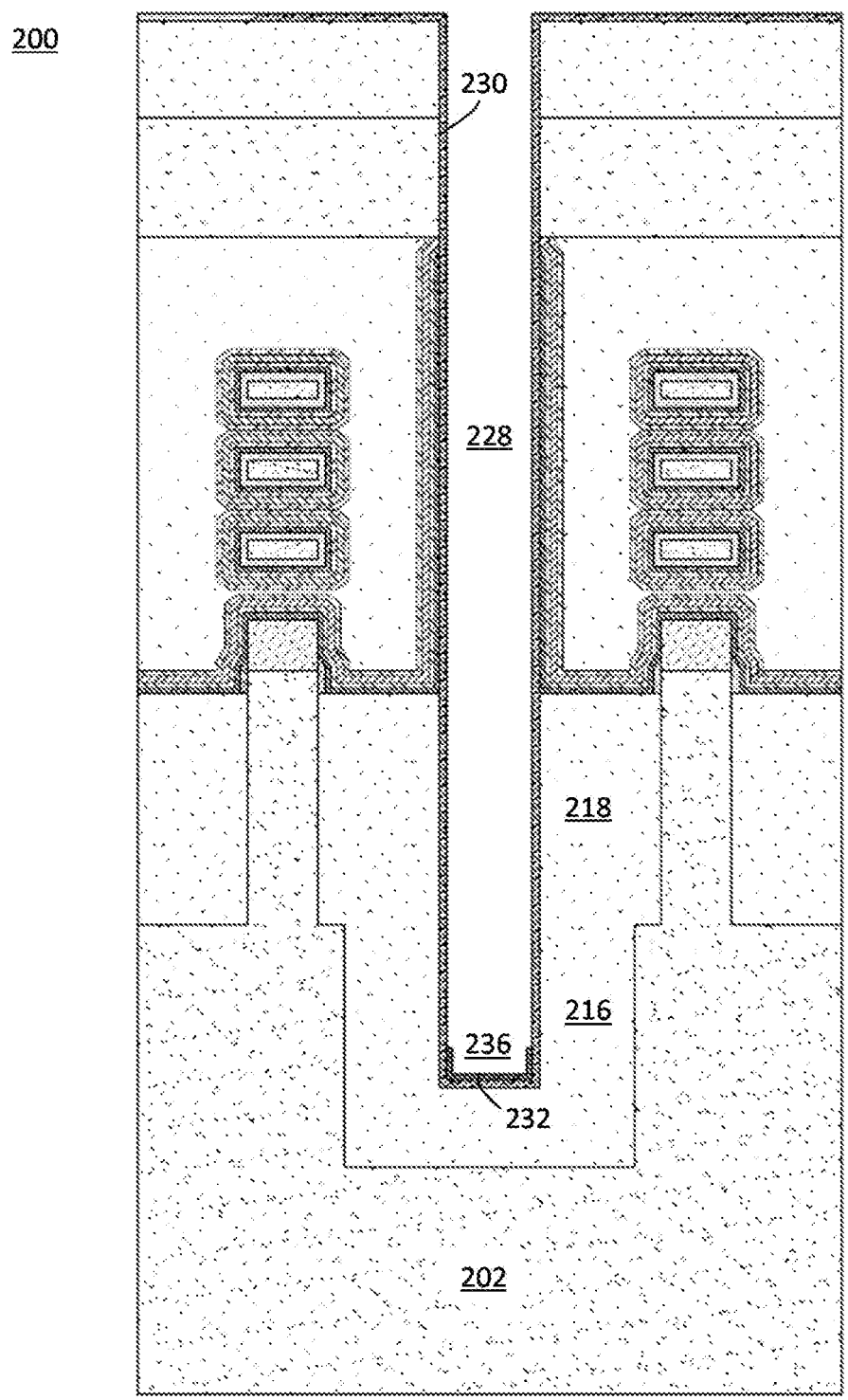
FIG. 2K illustrates an example of a component following the performance of a portion of the example method of FIG. 1, in accordance with embodiments of the present disclosure.

FIG. 2K depicts the structure 200 following the performance of this portion of operation 116. As shown, the remaining OPL 234 (shown in FIG. 2J) has been removed from the buried power rail trench 228 such that a cavity 236 is formed by the remaining TiN layer 232 at the bottom of the buried power rail trench 228. As shown, the cavity 236 is formed within the DTI 216 of the structure 200.

In accordance with the first illustrative embodiment, the performance of operation 116 further includes selectively growing palladium in the cavity of the TiN layer. The plating of the palladium is controlled by the presence of the TiN layer. Specifically, palladium will readily grow on the TiN layer, but not on the SiCN liner. Notably, plating of palladium on TiN results in a robust plug of palladium that is relatively free of voids and is capable of serving as a seed layer for the electroless plating of cobalt thereon, as discussed in further detail below.

Figure 2L:
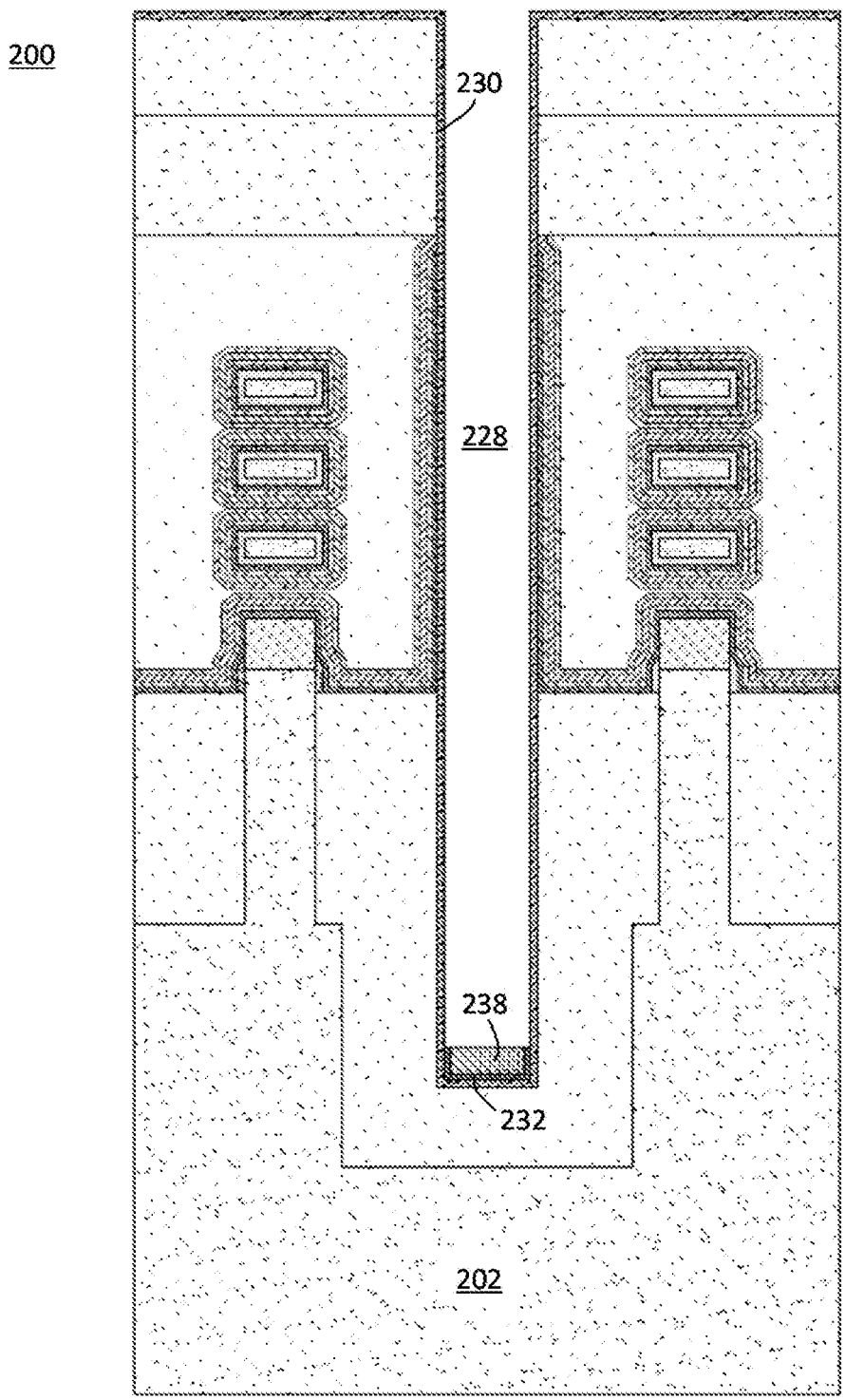
FIG. 2L illustrates an example of a component following the performance of a portion of the example method of FIG. 1, in accordance with embodiments of the present disclosure.

FIG. 2L depicts the structure 200 following the performance of this portion of operation 116. As shown, the cavity 236 (shown in FIG. 2K) has been filled with a plug 238 of palladium formed by the plating of palladium on the TiN layer 232.

In accordance with the first illustrative embodiment, following the performance of this portion of operation 116, the buried power rail trench has been prepared for the formation of the buried power rail. Therefore, FIG. 2L depicts the structure 200 following the performance of operation 116, in accordance with the first illustrative embodiment.

Returning to FIG. 1, the method 100 proceeds from operation 116 to operation 120, wherein the buried power rail is formed. In accordance with the first illustrative embodiment of the present disclosure, the performance of operation 120 includes bottom-up electroless growth of cobalt on the palladium seed layer provided by the plug of palladium. Notably, this type of electroless growth of cobalt forms the buried power rail without the formation of voids, which are problematically introduced by other methods of filling a buried power rail trench having a high aspect ratio. Accordingly, this method enables an advantageous method for the metallization of a high aspect ratio buried power rail.

Figure 2M:
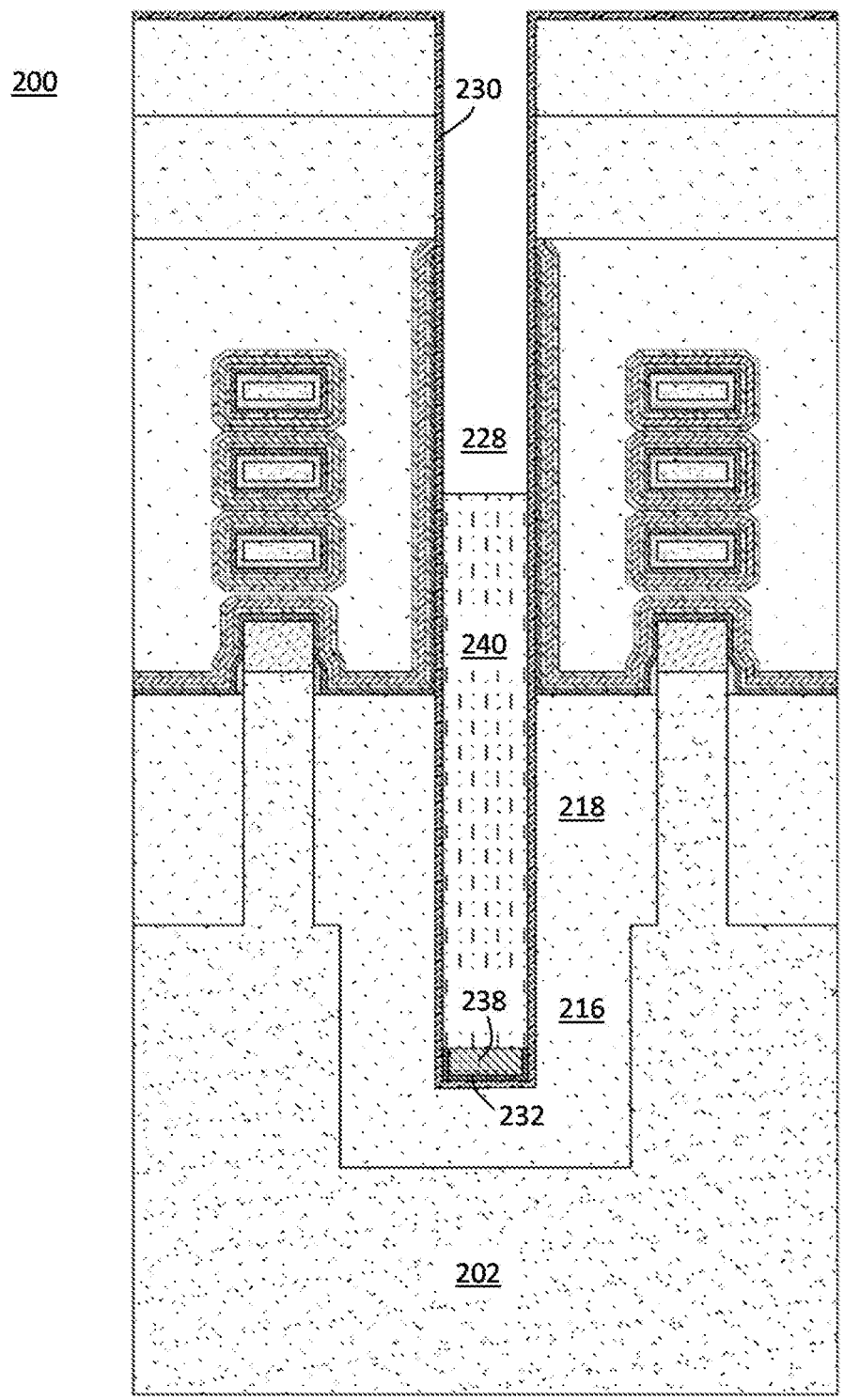
FIG. 2M illustrates an example of a component following the performance of a portion of the example method of FIG. 1, in accordance with embodiments of the present disclosure.

FIG. 2M depicts the structure 200 following the performance of operation 120. As shown, the plug 238 of palladium has provided a palladium seed layer in the bottom of the buried power rail trench 228 for the bottom-up electroless of cobalt thereon. The cobalt grown on the palladium seed layer forms the buried power rail 240. As shown, the buried power rail 240 has been formed extending through the STI 218 and into the DTI 216, thereby enabling the advantages of buried power rails having high aspect ratios, discussed above, without the disadvantages of the formation of voids in the buried power rail metal.

Notably, the formation of the cobalt by electroless plating on the plug 238 of palladium to form the buried power rail 240 is such that cobalt fills the entire width of the buried power rail trench 228. As a result, the cobalt of the buried power rail 240 is grown in direct contact with the uppermost surface of the TiN layer 232. In other words, as shown in FIG. 2M, the nature of the electroless plating of the cobalt on the palladium plug 238 causes the resulting buried power rail 240 to be in direct contact with the plug 238, with the TiN layer 232, and with the SiCN liner 230. Additionally, the height of the buried power rail is controlled by the specifications of the electroless plating processes. For example, the duration of the electroless plating procedure.

Returning to FIG. 1, the method 100 proceeds from operation 120 to operation 124, wherein the structure is finalized. In accordance with at least one embodiment of the present disclosure, the performance of operation 124 further includes the performance of a number of sub-operations.

In accordance with at least one embodiment of the present disclosure, finalizing the structure includes filling the remainder of the buried power rail trench, above the buried power rail, with nitride. In such embodiments, a CMP process is then performed on the structure to remove the SiCN liner and oxide layer from the top of the structure and to planarize the nitride and nitride material.

Figure 2N:
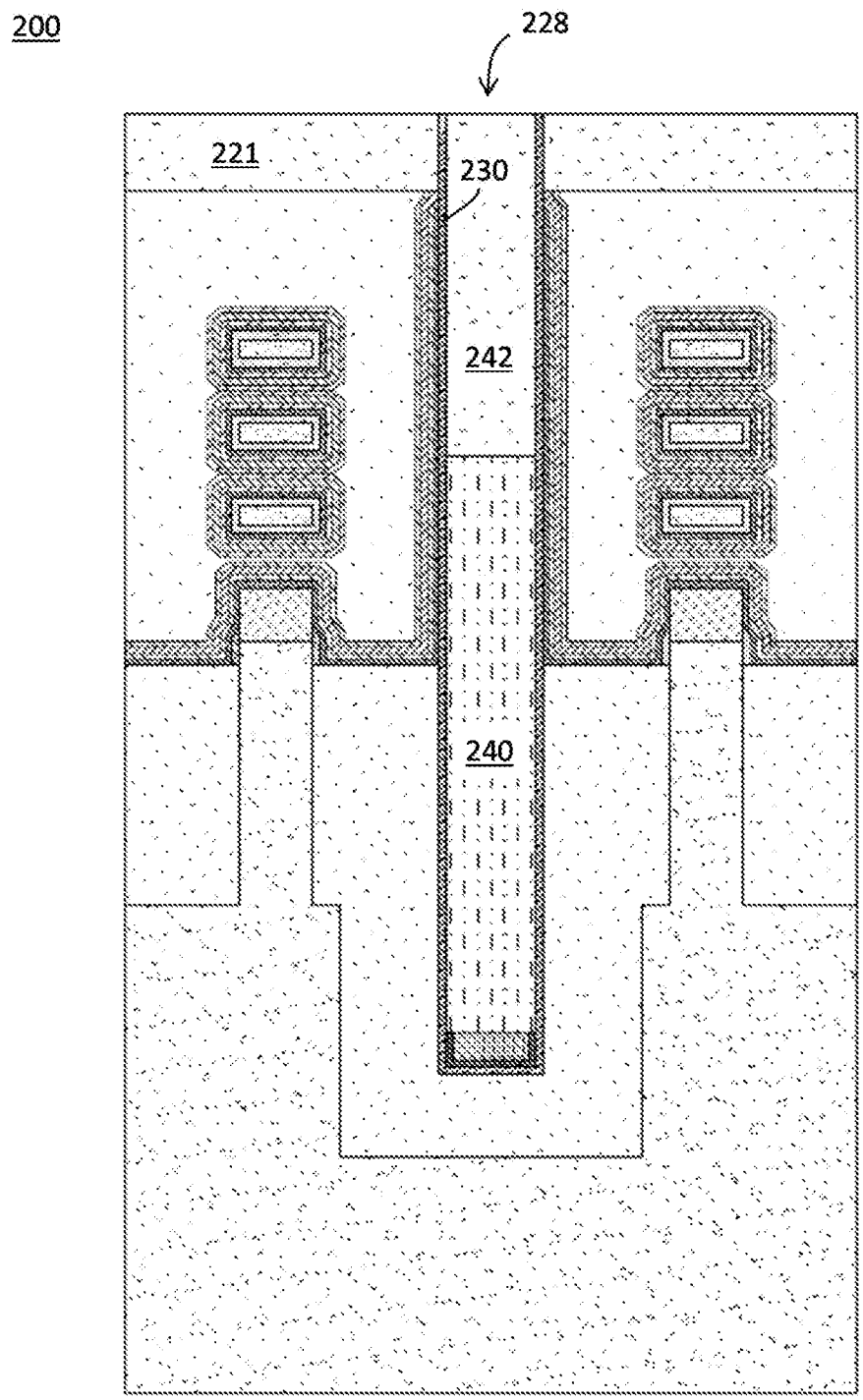
FIG. 2N illustrates an example of a component following the performance of a portion of the example method of FIG. 1, in accordance with embodiments of the present disclosure.

FIG. 2N depicts the structure 200 following the performance of this portion of operation 124. As shown, the remainder of the buried power rail trench 228 has been filled with nitride 242 above the buried power rail 240. A CMP process has then been performed to remove the SiCN liner 230 and oxide layer 226 (shown in FIG. 2F) from above the nitride material 221 and to planarize the uppermost surfaces of the nitride material 221 and nitride 242.

In accordance with at least one embodiment of the present disclosure, finalizing the structure further includes forming alternating oxide and nitride layers on top of the planarized nitride and forming MOL and BEOL contacts therethrough to establish electrical contact with the buried power rail. The formation of metal interconnect contacts in the performance of operation 124 is not within the scope of this disclosure and can be achieved in any suitable manner.

Figure 2O:
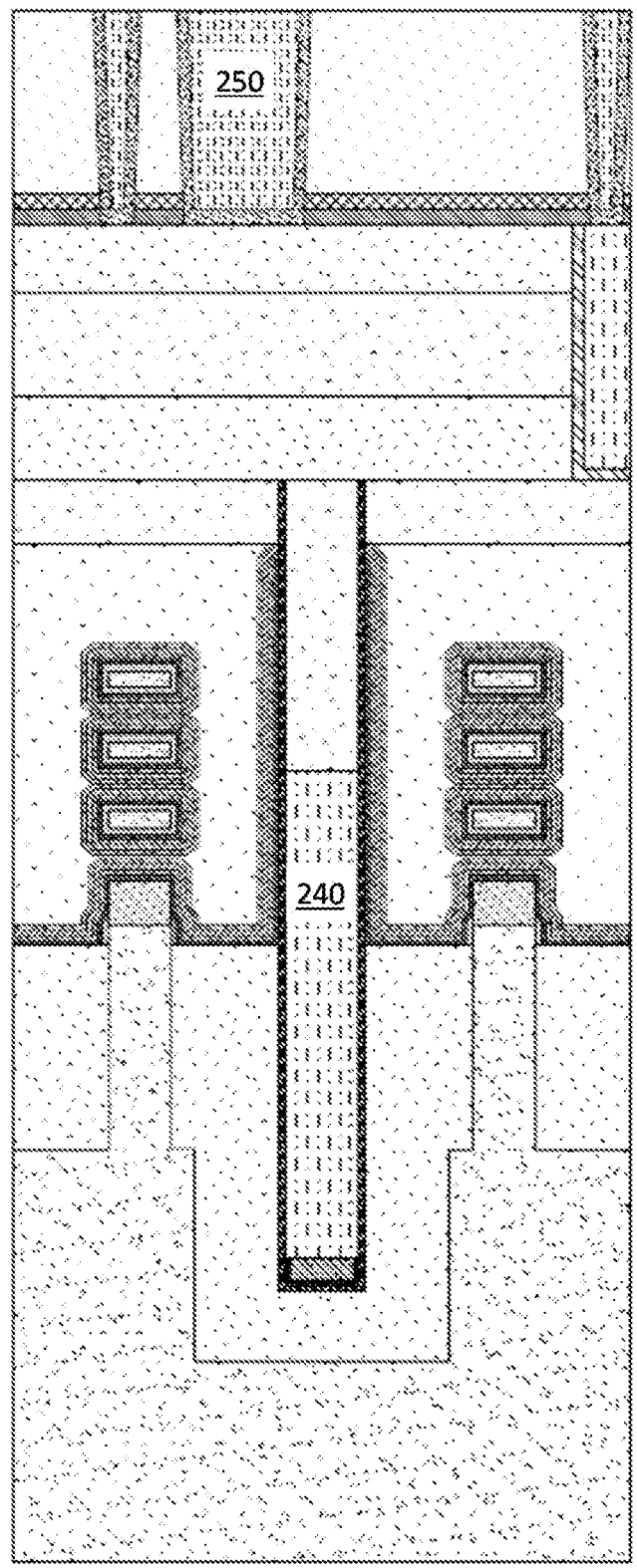
FIG. 2O illustrates an example of a component following the performance of a portion of the example method of FIG. 1, in accordance with embodiments of the present disclosure.
Figure 2P:
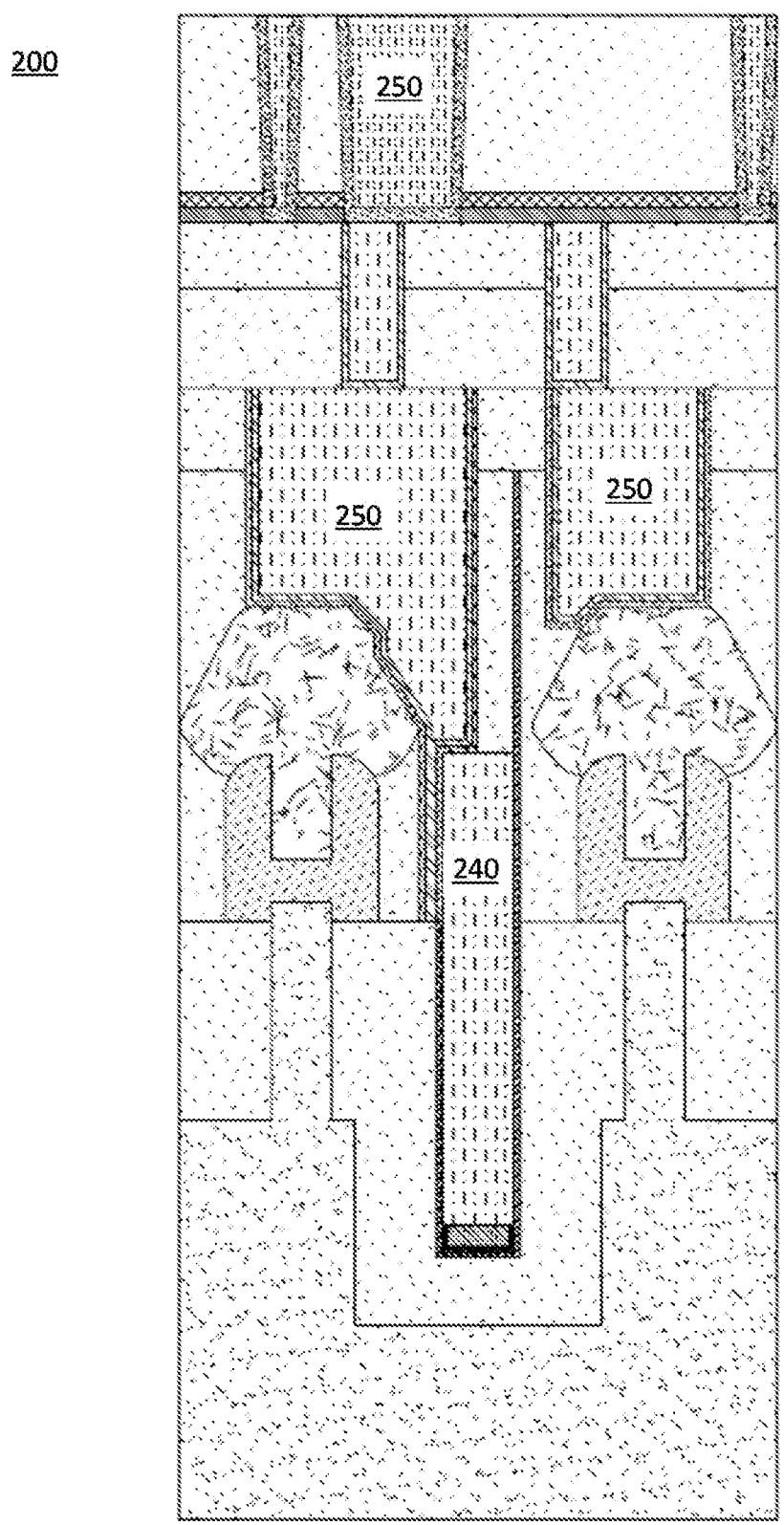
FIG. 2P illustrates an example of a component following the performance of a portion of the example method of FIG. 1, in accordance with embodiments of the present disclosure.

FIGS. 2O and 2P depict the structure 200 following the performance of this portion of operation 124. More specifically, FIG. 2O depicts a cross-section of the structure 200 taken at a gate region and FIG. 2P depicts a cross-section of the structure 200 taken at a source/drain region of the structure. Accordingly, the electrical contact established between the buried power rail 240 and the metal interconnect contacts 250 is not visible in FIG. 2O but is visible in FIG. 2P.

As noted above, the performance of operations 116 and 120 of the method 100 can alternatively be achieved in accordance with a second illustrative embodiment, which is discussed with reference to FIGS. 3A-3D. Accordingly, the second illustrative embodiment begins with the structure 200 as shown in FIG. 2G, following the formation of the TiN layer 232 in the performance of operation 112. Notably, all previously formed portions of the structure 300 (shown in FIGS. 3A-3D) were formed in the performance of operations 104, 108, and 112 of the method 100 and therefore are identified and labeled in FIGS. 3A-3D in the same manner as in FIGS. 2A-2G.

In particular, in accordance with the second illustrative embodiment, the performance of operation 116 includes partially filling the buried power rail trench with OPL for a chamfer. Notably, this is in contrast to the performance of operation 116 in the first illustrative embodiment, wherein the entirety of the buried power rail trench is filled with OPL. In accordance with embodiments of the present disclosure, the buried power rail trench is filled with OPL, and the OPL is then recessed to the desired height within the buried power rail trench.

Figure 3A:
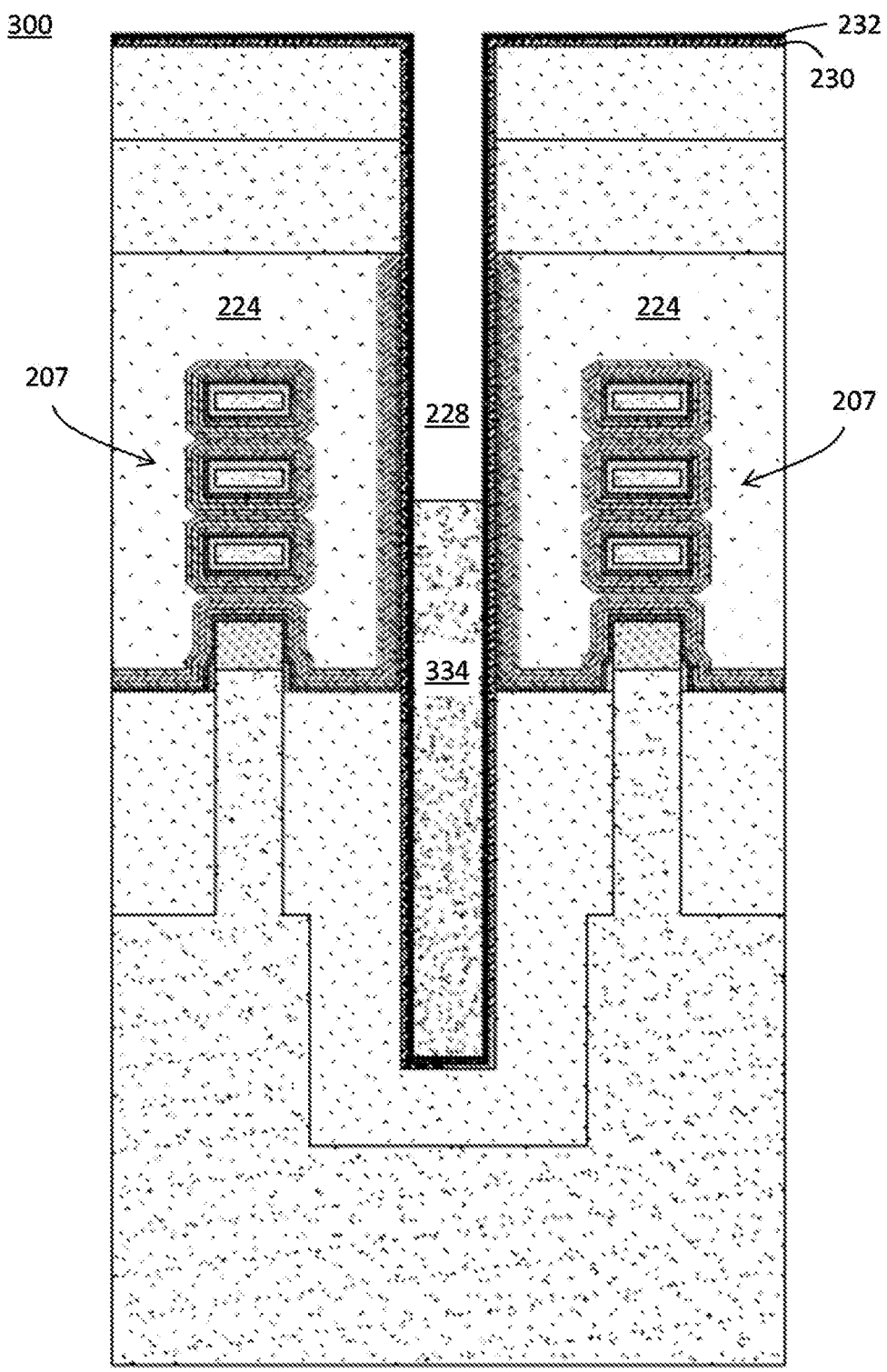
FIG. 3A illustrates an example of a component following the performance of a portion of the example method of FIG. 1, in accordance with embodiments of the present disclosure.

FIG. 3A depicts the structure 300 following the performance of this portion of operation 116. As shown, OPL 334 partially fills the buried power rail trench 228 such that the TiN layer 232 is arranged between the OPL 334 and the SiCN liner 230. As shown, the OPL 334 is filled and recessed to a height within the buried power rail trench 228 such that an uppermost surface of the OPL 334 is substantially level with a middle region of the p-work function metal stacks 207 arranged in the areas of tungsten 224.

In accordance with the second illustrative embodiment, the performance of operation 116 further includes performing an isotropic TiN wet etch to recess the height of the TiN layer within the buried power rail trench. As discussed above with respect to the isotropic wet etch performed in the first illustrative embodiment, except for the remaining recessed portion of the TiN layer within the buried power rail trench, the isotropic TiN wet etch removes the TiN layer from the remainder of the interior surfaces of the buried power rail trench, exposing the SiCN liner that remains covering the interior surfaces of the buried power rail trench.

Figure 3B:
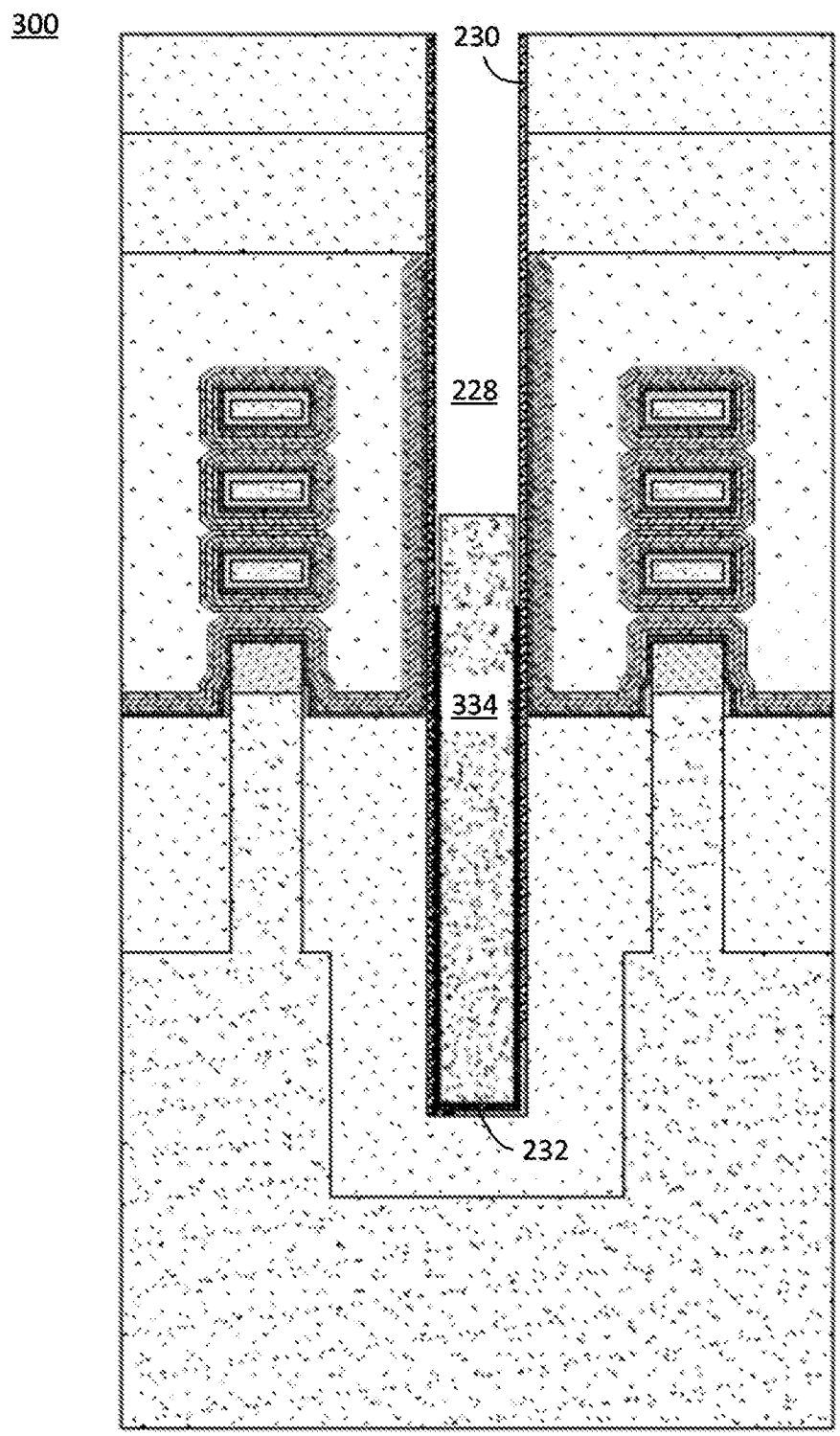
FIG. 3B illustrates an example of a component following the performance of a portion of the example method of FIG. 1, in accordance with embodiments of the present disclosure.

FIG. 3B depicts the structure 300 following the performance of this portion of operation 116. As shown, the TiN layer 232 has been isotropically etched such that it has been removed entirely from all surfaces on which it was not covered by the OPL 334. Furthermore, the isotropic TiN wet etch process enables the removal of a portion of the TiN layer 232 that is arranged between the OPL 334 and the SiCN liner 230. In other words, following the etch process, a portion of the TiN layer 232 arranged between the OPL 334 and the SiCN liner 230 remains. The amount of TiN layer 232 that is left following the etch process is controllable by the specifications of the etch process, such as the duration. The amount of TiN layer 232 that is left following the etch process is an amount sufficient to contain the cobalt for the buried power rail, as discussed in further detail below.

In accordance with the second illustrative embodiment, the performance of operation 116 further includes performing an OPL ash to remove the OPL from the bottom of the buried power rail trench after the isotropic TiN wet etch process has been performed. Once the OPL is removed, a cavity is formed by the remaining TiN layer at the bottom of the buried power rail trench.

Figure 3C:
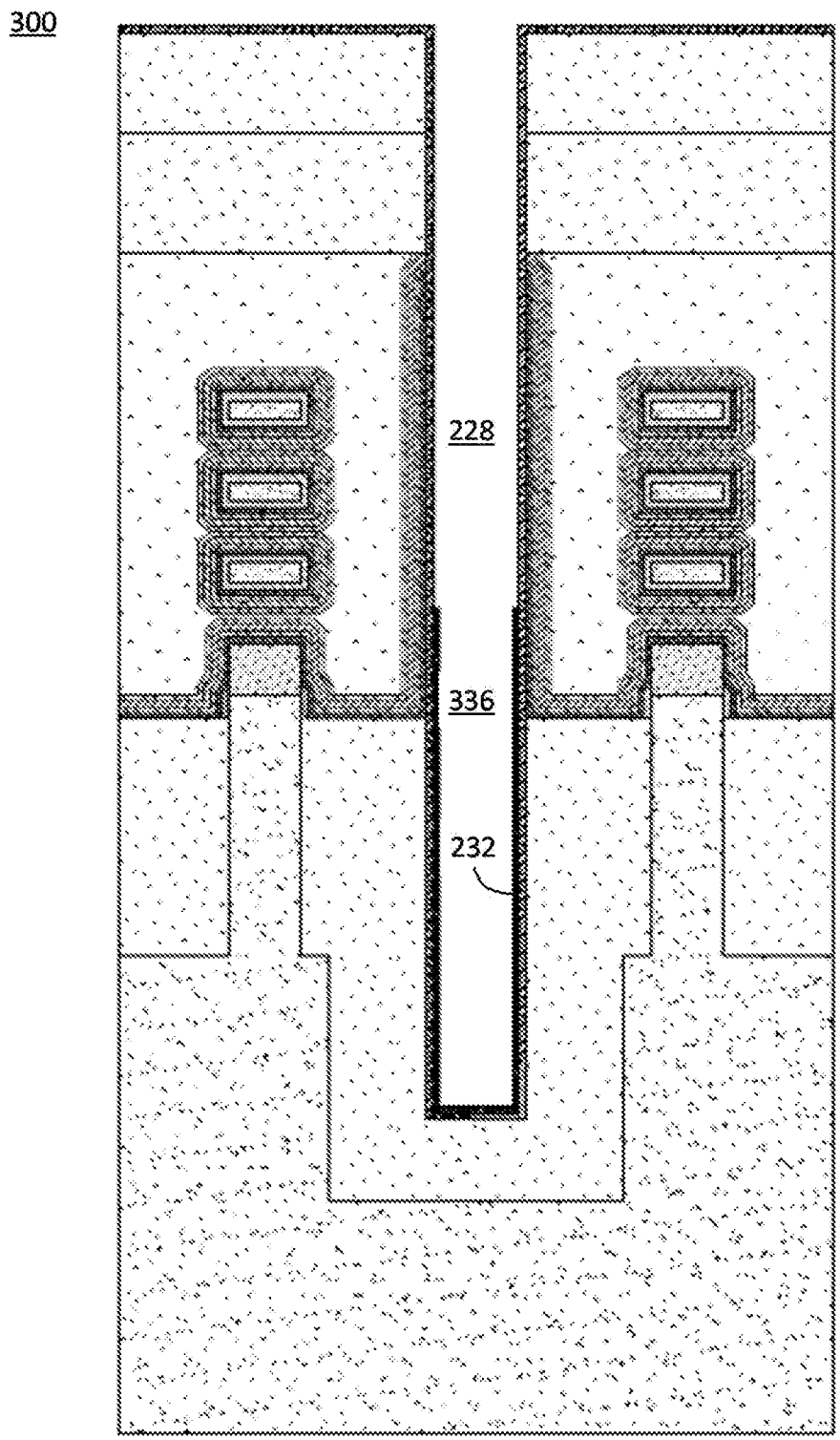
FIG. 3C illustrates an example of a component following the performance of a portion of the example method of FIG. 1, in accordance with embodiments of the present disclosure.

FIG. 3C depicts the structure 300 following the performance of this portion of operation 116. As shown, the OPL 334 (shown in FIG. 3B) has been removed from the buried power rail trench 228 such that a cavity 336 is formed by the remaining TiN layer 232 at the bottom of the buried power rail trench 228. Notably, the cavity 336 of structure 300 is substantially deeper than the cavity 236 of the structure 200 (shown in FIG. 2K), discussed above. Put another way, the height of the TiN layer 232 in the structure 300 is substantially taller than that in the structure 200. This difference is due to the formation of the cobalt buried power rail without a palladium seed layer in the second illustrative embodiment, as discussed in further detail below.

In accordance with the second illustrative embodiment, the performance of this portion of operation 116, the buried power rail trench has been prepared for the formation of the buried power rail. Therefore, FIG. 3C depicts the structure 300 following the performance of operation 116, in accordance with the second illustrative embodiment.

Returning to FIG. 1, the method 100 proceeds from operation 116 to operation 120, wherein the buried power rail is formed. In accordance with the second illustrative embodiment of the present disclosure, the performance of operation 120 includes electroless plating of cobalt on the surface of the TiN provided by the cavity. Notably, this type of growth forms the buried power rail without the formation of voids, which are problematically introduced by other methods of filling a buried power rail trench having a high aspect ratio. Accordingly, this method enables an advantageous method for the metallization of a high aspect ratio buried power rail.

Figure 3D:
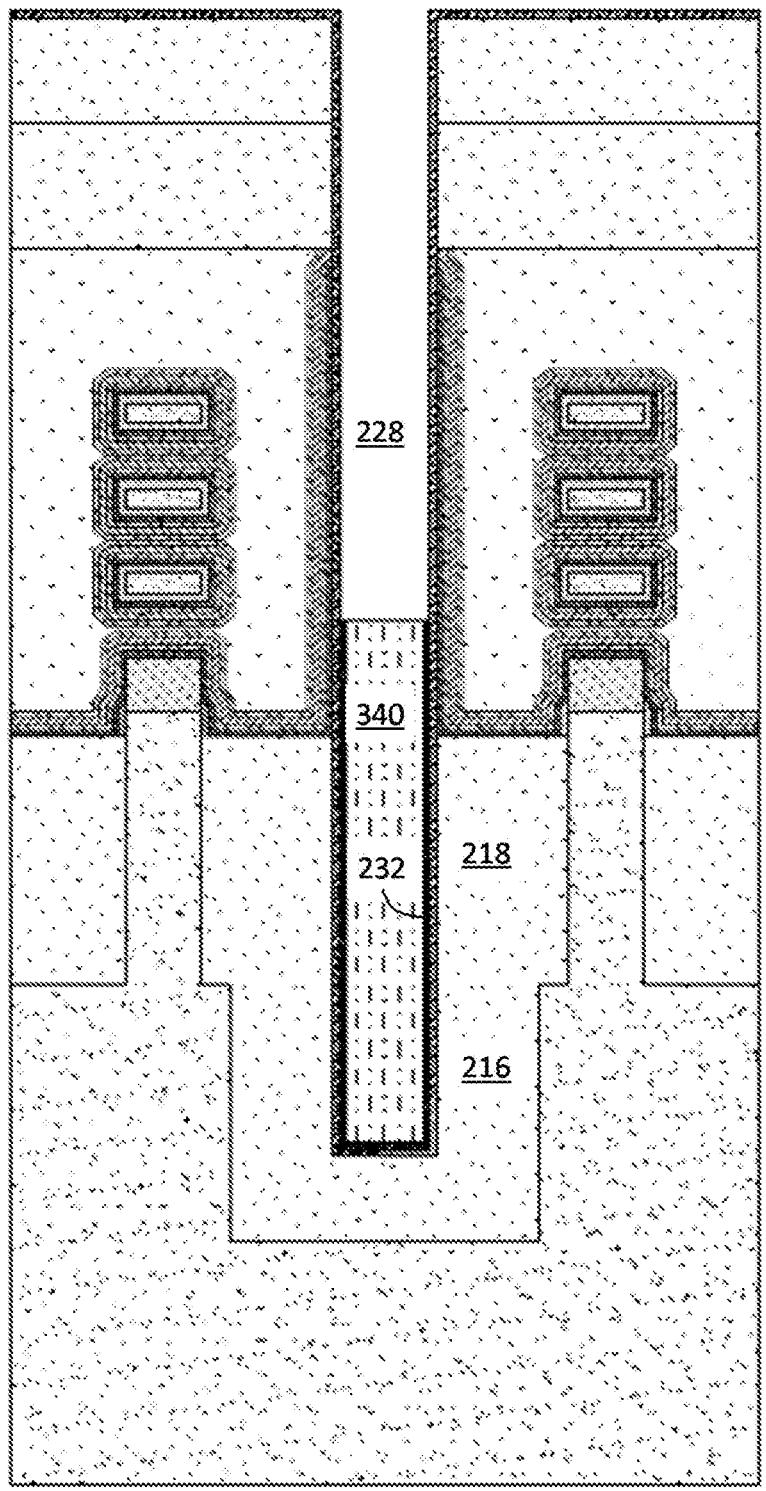
FIG. 3D illustrates an example of a component following the performance of a portion of the example method of FIG. 1, in accordance with embodiments of the present disclosure.

FIG. 3D depicts the structure 300 following the performance of operation 120. As shown, the cavity 336 (shown in FIG. 3C) formed by the remaining TiN layer 232 has provided a surface of TiN in the bottom of the buried power rail trench 228 for the electroless plating of cobalt thereon. The cobalt grown on the TiN surface of the cavity forms the buried power rail 340. As shown, the buried power rail 340 has been formed extending through the STI 218 and into the DTI 216, thereby enabling the advantages of buried power rails having high aspect ratios, discussed above, without the disadvantages of the formation of voids in the buried power rail metal.

Returning to FIG. 1, the method 100 proceeds from operation 120 to operation 124, wherein the structure is finalized. Notably, the performance of operation 124 is carried out in substantially the same manner as discussed above. In other words, the performance of operation 124 can proceed from the structure 300 as shown in FIG. 3D in substantially the same manner as from the structure 200 as shown in FIG. 2M.

As discussed above, the first illustrative embodiment utilizes a seed layer of palladium that was plated on a TiN surface to promote the growth of cobalt thereon. In contrast, the second illustrative embodiment utilizes the TiN surface to promote the growth of cobalt thereon. One advantage of the first illustrative embodiment relative to the second illustrative embodiment is that the cobalt is grown in contact with the SiCN liner and can therefore utilize a greater width in the buried power rail trench than the cobalt grown on the TiN layer because the TiN layer takes up some additional width within the buried power rail trench. This advantage can be seen by comparing the buried power rail 240 shown in FIG. 2M with the buried power rail 340 shown in FIG. 3D. One advantage of the second illustrative embodiment relative to the first illustrative embodiment is that the performance of operation 116 requires the performance of fewer sub-operations in the formation of the buried power rail 340 relative to the buried power rail 240. Whether the buried power rail is formed utilizing the first or second illustrative embodiment of operations 116 and 120, the resulting structure is a high aspect ratio buried power rail made of cobalt that is formed without the introduction of voids.

Figure 4:
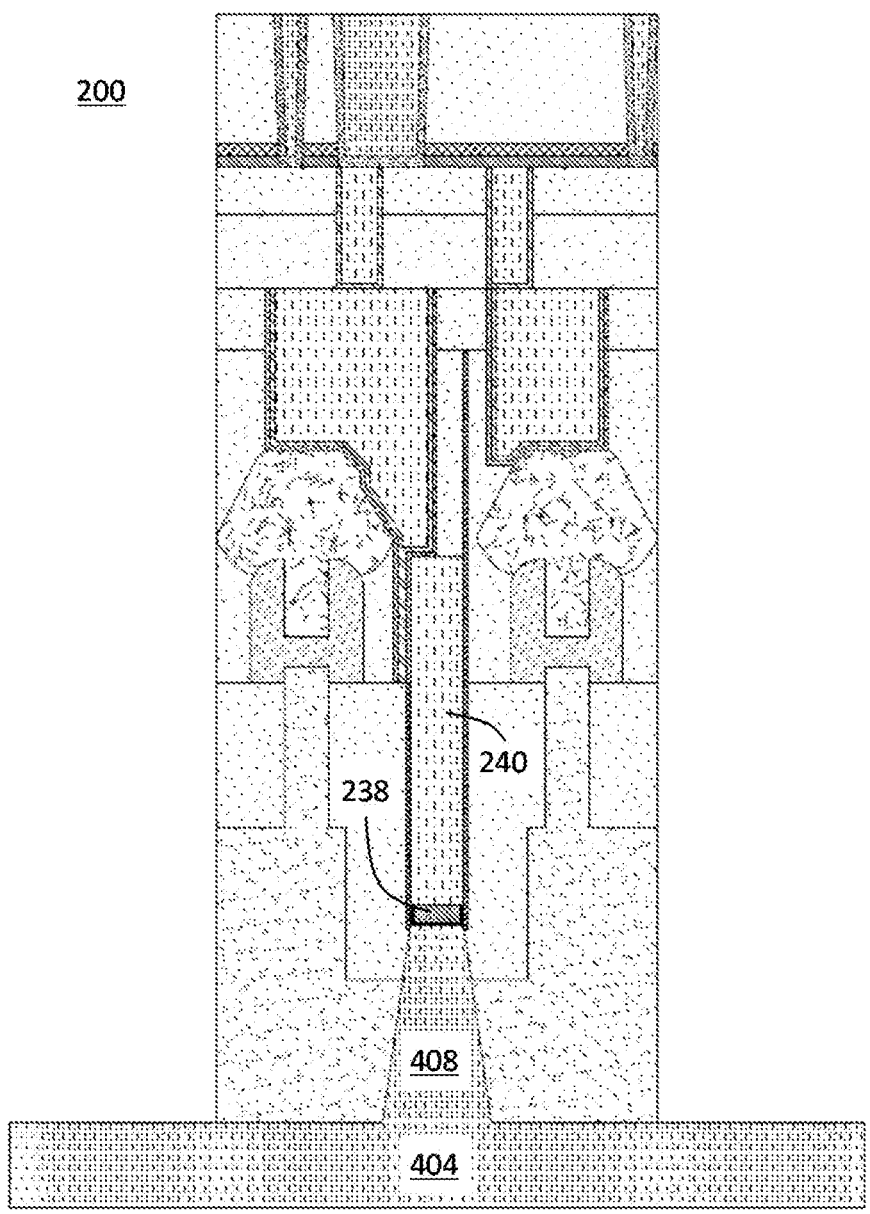
FIG. 4 illustrates an example of a component formed according to the example method of FIG. 1 that has been integrated with a backside power delivery network, in accordance with embodiments of the present disclosure.

FIG. 4 illustrates one embodiment of the present disclosure wherein the structure 200, as shown in FIG. 2P, is integrated with a BSPDN 404. As shown, contact between the BSPDN 404 and the buried power rail 240 is established by contact between the palladium plug 238 and a BSPDN tap 408.

Figure 5:
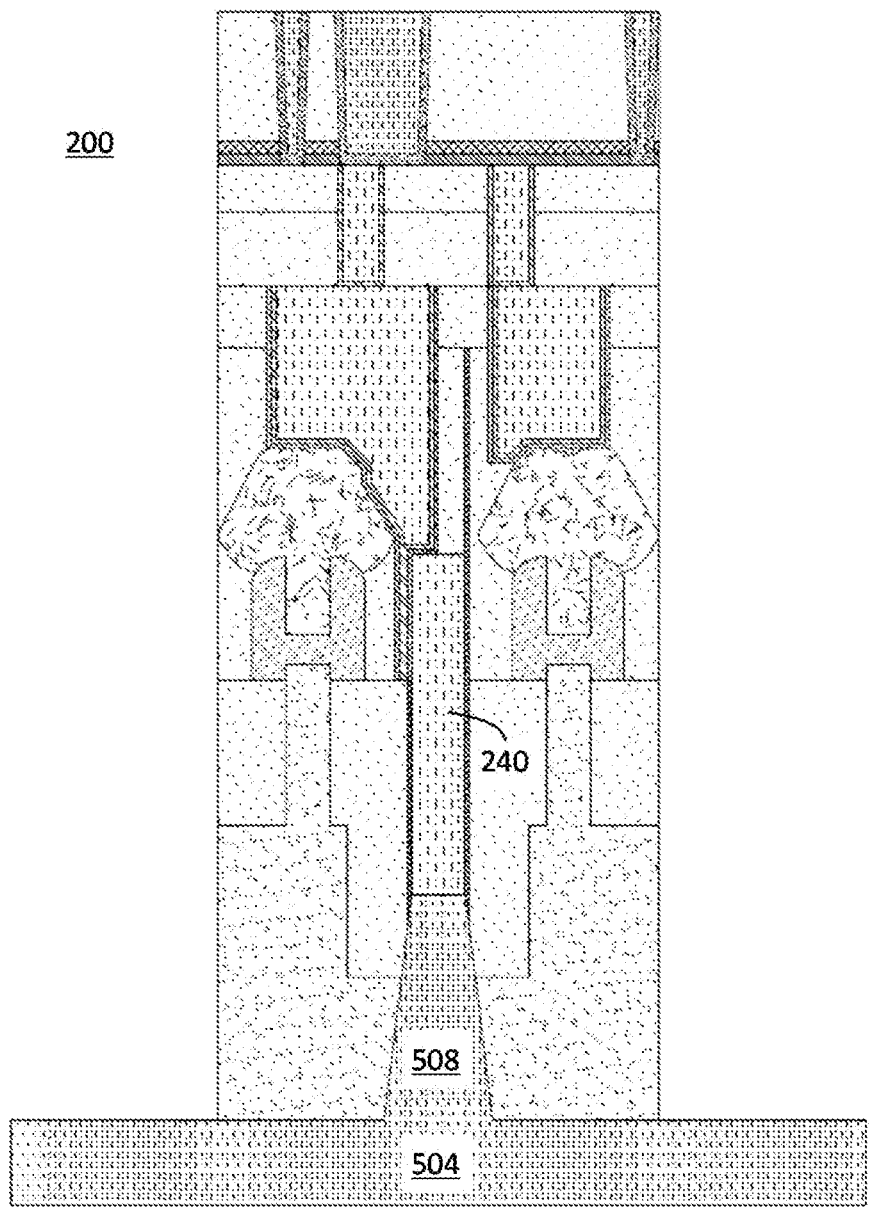
FIG. 5 illustrates an example of a component formed according to the example method of FIG. 1 that has been integrated with a backside power delivery network, in accordance with embodiments of the present disclosure.

FIG. 5 illustrates another embodiment of the present disclosure wherein the structure 200, as shown in FIG. 2P, is integrated with a BSPDN 504. In this embodiment, the palladium plug 238 (shown in FIG. 2P) is etched away prior to the establishment of the connection between the BSPDN 504 and the buried power rail 240 by the BSPDN tap 508.

Notably, the embodiment shown in FIG. 5 could alternatively be used to integrate the structure 300 shown in FIG. 3D with the BSPDN 504 (following the performance of operation 124) without necessitating the removal of the palladium plug.

In addition to embodiments described above, other embodiments having fewer operational steps, more operational steps, or different operational steps are contemplated.

Also, some embodiments may perform some or all of the above operational steps in a different order. Furthermore, multiple operations may occur at the same time or as an internal part of a larger process.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used, and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100*a*, 100*b*, 100*c*) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present invention has been described in terms of specific embodiments, it is anticipated that alterations and modification thereof will become apparent to the skilled in the art. Therefore, it is intended that the following claims be interpreted as covering all such alterations and modifications as fall within the true spirit and scope of the invention.

What is claimed is:

1. A semiconductor component, comprising:
    an area of dielectric material extending below an uppermost surface of a substrate;
    a trench formed so as to extend from above the uppermost surface of the substrate into the area of dielectric material;
    a non-metal liner coating interior surfaces of the trench;
    a metal liner coating interior surfaces of the non-metal liner; and
    a power rail formed in the trench in direct contact with at least one of the metal liner or the non-metal liner such that the power rail extends into the area of dielectric material and above the uppermost surface of the substrate,
    wherein a height of the metal liner is less than a height of the power rail.

2. The semiconductor component of claim 1, wherein the non-metal liner is made of silicon carbon nitride.

3. The semiconductor component of claim 1, wherein the metal liner is made of titanium nitride.

4. The semiconductor component of claim 1, wherein the power rail is made of cobalt.

5. The semiconductor component of claim 1, wherein:
    the metal liner is formed in direct contact with the non-metal liner such that the non-metal liner is arranged between the metal liner and the interior surfaces of the trench.

6. The semiconductor component of claim 5, wherein:
    the non-metal liner is made of silicon carbon nitride; and
    the metal liner is made of titanium nitride.

7. The semiconductor component of claim 6, wherein:
the non-metal liner extends along a height that is equal to a height of the trench; and
the metal liner extends along the height that is less than the height of the non-metal liner.

8. The semiconductor component of claim 7, further comprising a plug filling the metal liner.

9. The semiconductor component of claim 8, wherein the plug is made of palladium.

10. The semiconductor component of claim 8, wherein the power rail is formed in direct contact with the plug.

11. A semiconductor component, comprising:
an area of dielectric material extending below an uppermost surface of a substrate;
a trench formed so as to extend from above the uppermost surface of the substrate into the area of dielectric material;
a non-metal liner coating interior surfaces of the trench;
a metal liner coating the non-metal liner such that the non-metal liner separates the metal liner from the interior surfaces of the trench, wherein the metal liner extends along a height that is less than a height of the non-metal liner;
a power rail formed in the trench in direct contact with the non-metal liner such that the power rail extends into the area of dielectric material and above the uppermost surface of the substrate.

12. The semiconductor component of claim 11, wherein the metal liner is filled with a palladium plug.

13. The semiconductor component of claim 12, wherein the power rail is in direct contact with the palladium plug.

14. The semiconductor component of claim 11, wherein the height of the metal liner is less than a height of the power rail.

15. The semiconductor component of claim 12, wherein the power rail is in direct contact with an uppermost surface of the metal liner.

* * * * *